United States Patent
Land

(10) Patent No.: US 10,753,010 B2
(45) Date of Patent: Aug. 25, 2020

(54) VAPOR DEPOSITION APPARATUS AND TECHNIQUES USING HIGH PURITIY POLYMER DERIVED SILICON CARBIDE

(71) Applicant: MELIOR INNOVATIONS, INC., Houston, TX (US)

(72) Inventor: Mark S. Land, Houston, TX (US)

(73) Assignee: Pallidus, Inc., Albany, NY (US)

( * ) Notice: Subject to any disclaimer, the term of this patent is extended or adjusted under 35 U.S.C. 154(b) by 154 days.

(21) Appl. No.: 15/275,055

(22) Filed: Sep. 23, 2016

(65) Prior Publication Data

US 2017/0204532 A1 Jul. 20, 2017

Related U.S. Application Data

(63) Continuation-in-part of application No. 14/864,125, filed on Sep. 24, 2015.
(Continued)

(51) Int. Cl.
| | |
|---|---|
| *C23C 14/06* | (2006.01) |
| *C01B 32/977* | (2017.01) |
| *C30B 25/02* | (2006.01) |
| *C30B 29/36* | (2006.01) |
| *C04B 35/571* | (2006.01) |
| *C04B 35/80* | (2006.01) |
| *C08G 77/20* | (2006.01) |
| *C08G 77/50* | (2006.01) |
| *C04B 35/56* | (2006.01) |
| *C01B 32/956* | (2017.01) |

(Continued)

(52) U.S. Cl.
CPC ............. *C30B 25/02* (2013.01); *C01B 32/956* (2017.08); *C01B 32/977* (2017.08); *C04B 35/56* (2013.01); *C04B 35/5603* (2013.01); *C04B 35/571* (2013.01); *C04B 35/806* (2013.01); *C08G 77/20* (2013.01); *C08G 77/50* (2013.01); *C08L 83/04* (2013.01); *C23C 14/0635* (2013.01); *C30B 29/36* (2013.01); *C04B 2235/3418* (2013.01); *C04B 2235/3826* (2013.01); *C04B 2235/3895* (2013.01); *C04B 2235/44* (2013.01); *C04B 2235/48* (2013.01); *C04B 2235/483* (2013.01); *C04B 2235/528* (2013.01); *C04B 2235/5427* (2013.01); *C04B 2235/5436* (2013.01); *C04B 2235/6581* (2013.01); *C04B 2235/72* (2013.01); *C04B 2235/77* (2013.01); *C04B 2235/94* (2013.01); *C04B 2235/96* (2013.01); *C08G 77/12* (2013.01); *C08G 77/80* (2013.01)

(58) Field of Classification Search
CPC . C23C 14/0635; C01B 32/956; C01B 32/963; C01B 32/977
See application file for complete search history.

(56) References Cited

U.S. PATENT DOCUMENTS

| | | |
|---|---|---|
| 4,877,820 A | 10/1989 | Cowan |
| 2006/0225645 A1* | 10/2006 | Powell .................... C30B 23/00 117/105 |

(Continued)

*Primary Examiner* — Elizabeth A Burkhart
(74) *Attorney, Agent, or Firm* — Glen P. Belvis; Belvis Law, LLC.

(57) ABSTRACT

Organosilicon chemistry, polymer derived ceramic materials, and methods. Such materials and methods for making polysilocarb (SiOC) and Silicon Carbide (SiC) materials having 3-nines, 4-nines, 6-nines and greater purity. Vapor deposition processes and articles formed by those processes utilizing such high purity SiOC and SiC.

10 Claims, 10 Drawing Sheets

Related U.S. Application Data

(60) Provisional application No. 62/055,497, filed on Sep. 25, 2014, provisional application No. 62/055,461, filed on Sep. 25, 2014, provisional application No. 62/232,355, filed on Sep. 24, 2015.

(51) Int. Cl.
*C08L 83/04* (2006.01)
*C08G 77/12* (2006.01)
*C08G 77/00* (2006.01)

(56) References Cited

U.S. PATENT DOCUMENTS

| | | | | |
|---|---|---|---|---|
| 2007/0034145 | A1* | 2/2007 | Maruyama | C30B 23/00 117/105 |
| 2007/0138706 | A1* | 6/2007 | Metzger | B01J 6/008 264/432 |
| 2013/0061801 | A1* | 3/2013 | Fujiwara | C30B 23/002 117/105 |
| 2013/0309496 | A1* | 11/2013 | Zwieback | C30B 28/12 428/402 |
| 2014/0220298 | A1* | 8/2014 | Loboda | C30B 23/025 428/141 |

\* cited by examiner

VAPOR DEPOSITION APPARATUS AND TECHNIQUES USING HIGH PURITTY POLYMER DERIVED SILICON CARBIDE

This application: (i) claims under 35 U.S.C. § 119(e)(1) the benefit U.S. provisional application Ser. No. 62/232,355 filing date of Sep. 24, 2015; and (ii) is a continuation-in-part of U.S. patent application Ser. No. 14/864,125 filed Sep. 24, 2015, which claims under 35 U.S.C. § 119(e)(1) the benefit of U.S. provisional application Ser. No. 62/055,461 filing date of Sep. 25, 2014 and U.S. provisional application Ser. No. 62/055,497 filing date of Sep. 25, 2014, the entire disclosures of each of which are incorporated herein by reference.

BACKGROUND OF THE INVENTION

Field of the Invention

The present inventions relate to improvements in vapor deposition processes and crystal growth and materials growth that can be achieved using the novel ultra pure SiC and SiOC materials that are disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344), filed contemporaneously herewith, the entire disclosures of each of which are incorporated herein by reference.

The use of these materials having 6-nines, 7-nines, 8-nines and greater purity provides from many advantages in vapor deposition growth of crystals. And provides for new and refined vapor deposition apparatus and systems for crystal growth. The ultra high purity materials provide, among other things: faster crystal growth, the ability to grow larger and purer seed crystals or starting plates for the deposition process; the ability to use a larger percentage of the starting material used in the apparatus. Thus, enhanced control, greater efficiencies and high quality can be obtained by using the high purity and ultra pure materials in vapor deposition techniques.

In recent years the demand for high purity silicon carbide, and in particular high purity single crystalline carbide materials for use in end products, such as a semiconductor, has been increasing, but is believe to be unmet. For example, "single crystals are gaining more and more importance as substrate[s] for high frequency and high power silicon carbide electronic devices." Wang, et. al, *Synthesis of High Power Sic Powder for High-resistivity SiC Single crystals Growth*, p. 118 (J. Mater. Sic. Technol. Vol. 23, No 1, 2007)(hereinafter Wang). To obtain these high purity silicon carbide end products, silicon carbide powder as a starting or raw material must be exceedingly pure. However, "[c]ommercially available SiC powder is usually synthesized by carbothermal reduction of silica. Unfortunately, it is typically contaminated to the level that makes it unsuitable for SiC growth." Wang, at p. 118.

The longstanding need for, and problem of obtaining high purity silicon carbide, and the failing of the art to provide a viable (both from a technical and economical standpoint) method of obtaining this material was also recognized in Zwieback et al., 2013/0309496 ("Zwieback"), which provides that the "[a]vailability of high-purity SiC source material is important for the growth of SiC single crystals in general, and it is critical for semi-insulating SiC crystals" (Zwieback at ¶ 0007). Zwieback goes on to state that the prior methods including liquid based methods have consistently failed to meet this need: "While numerous modifications of the Acheson process have been developed over the years, the produced SiC material always contain high concentrations of boron, nitrogen aluminum and other metals, and is unsuitable as a source material for the growth of semiconductor-quality SiC crystals" (Zwieback at ¶ 0009); "commercial grade bulk SiC produced by CVD is not pure enough for the use as a source in SiC crystal growth" (Zwieback at ¶ 0010); the liquid process "produced SiC material contains large concentrations of contaminates and is unsuitable for the growth of semiconductor-quality SiC crystals" (Zwieback at ¶ 0011); and, the direct synthesis of SiC provides an impure material that "precludes the use of such material" (Zwieback at ¶ 0015). Zwieback itself seeks to address this long-standing need with a complex, multi-step version of what appears to be the direct process in a stated attempt to provide high purity SiC. It is believed that this process is neither technically or economically viable; and therefor that it cannot solve the longstanding need to provide commercial levels of high purity SiC.

Thus, although there are other known methods of obtaining silicon carbide, it is believed that none of these methods provide the requisite technical, capacity, and economical viability to provide the purity levels, amounts, and low cost required for commercial utilization and applications; and in particular to meet the ever increasing demands for semiconductor grade material, and other developing commercial utilizations and applications. "Among these synthesis methods, only CVD has been successfully used to produce high purity SiC powder, it is not suitable for mass production because of high costs associated with CVD technology." Wang, at p. 118.

CVD generally refers to Chemical Vapor Deposition. CVD is a type of vapor deposition technology. In addition to CVD, vapor deposition technologies would include PVD (Physical Vapor Deposition), plasma enhanced CVD, Physical Vapor Transport (PVT) and others.

Thus, for these end products, and uses, among others that require high purity materials, there is an ever increasing need for low cost silicon carbide raw material that has a purity of at least about 99.9%, at least about 99.99%, at least about 99.999%, and least about 99.9999% and at least about 99.99999% or greater. However, it is believe that prior to embodiments disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344), for all practical purposes, this need has gone unmet.

Further, prior to embodiments of the inventions disclosed and taught in Ser. No. 14/864,539 (US Publication No. 2016/0208412), Ser. No. 14/864,125 (US Publication No. 2016/0207782), and PCT/US2015/051997 (Publication No. WO 2016/049344), it is believed that high purity and ultrahigh purity SiOC materials, and in particular in quantities larger than small laboratory batches of a few ounces, have never been obtained, and thus their importance, benefits, and the need for such material, has gone largely unrecognized and unappreciated.

High purity single crystalline silicon carbide material has many desirable features and characteristics. For example, it is very hard having a Young's modulus of about 424 GPa. Polycrystalline silicon carbide may also have very high hardness, depending upon its grain structure and other factors.

As used herein, unless specified otherwise, the terms specific gravity, which is also called apparent density, should given their broadest possible meanings, and generally mean weight per untill volume of a structure, e.g., volumetric shape of material. This property would include internal porosity of a particle as part of its volume. It can be measured with a low viscosity fluid that wets the particle surface, among other techniques.

As used herein, unless specified otherwise, the terms actual density, which may also be called true density, should be given their broadest possible meanings, and general mean weight per unit volume of a material, when there are no voids present in that material. This measurement and property essentially eliminates any internal porosity from the material, e.g., it does not include any voids in the material.

Thus, a collection of porous foam balls (e.g., Nerf® balls) can be used to illustrate the relationship between the three density properties. The weight of the balls filling a container would be the bulk density for the balls:

$$\text{Bulk Density} = \frac{\text{weight of balls}}{\text{volume of container filled}}$$

The weight of a single ball per the ball's spherical volume would be its apparent density:

$$\text{Apparent Density} = \frac{\text{weight of one ball}}{\text{volume of that ball}}$$

The weight of the material making up the skeleton of the ball, i.e., the ball with all void volume removed, per the remaining volume of that material would be the actual density:

$$\text{Actual Density} = \frac{\text{weight of material}}{\text{volume of void free material}}$$

As used herein, unless stated otherwise, room temperature is 25° C. And, standard ambient temperature and pressure is 25° C. and 1 atmosphere.

Generally, the term "about" as used herein unless specified otherwise is meant to encompass a variance or range of ±10%, the experimental or instrument error associated with obtaining the stated value, and preferably the larger of these.

SUMMARY

There has been a long-standing and unfulfilled need for, among other things, improved and enhanced methods of vapor deposition SiC crystal growth.

The present inventions, among other things, solve these needs by providing the compositions, materials, articles of manufacture, devices and processes taught, disclosed and claimed herein.

Still additionally there are provided compositions, methods and articles having one or more of the following features: wherein the volumetric shape of silicon carbide has less than about 50 ppm total of the elements selected from the group consisting of Al, Fe, B, and P; wherein the volumetric shape of silicon carbide has less than about 40 ppm total of the elements selected from the group consisting of Al, Fe, B, and P; wherein the volumetric shape of silicon carbide has less than about 100 ppm total of the elements selected from the group consisting of Al, Fe, B and P wherein the volumetric shape of silicon carbide has less than about 1000 ppm total of the elements selected from the group consisting of Al, Fe, B and P; wherein the volumetric shape of silicon carbide has less than about 50 ppm total of the elements selected from the group consisting of Ti, Al, Fe, B, P, Pt, Ca, Mg, Li and Na; wherein the volumetric shape of silicon carbide has less than about 50 ppm total of the elements selected from the group consisting of Al, Fe, B, P, Pt, Ca, Mg, Li, Na, Ni, V, Pr, Ce, Cr, S and As; wherein the volumetric shape of silicon carbide has less than about 50 ppm total of the elements selected from the group consisting of Al, Fe, B, P, Pt, Ca, Mg, Li, Na, Ni, V, Ti, Ce, Cr, S and As; and, wherein the volumetric shape of silicon carbide has less than about 50 ppm total of the elements selected from the group consisting of Al, Fe, B, P, Pt, Ca, Mg, Li, Na, Ni, V, Pr, Ce, Cr, S and As.

Still additionally there are provided compositions, methods and articles having one or more of the following features: wherein the silicon carbide has less than about 90 ppm total of the elements selected from the group consisting of Ti, Al, Fe, B, P, Pt, Ca, Ce, Cr, S and As; wherein the silicon carbide has less than about 90 ppm total of the elements selected from the group consisting of Ti, Fe, P, Pt, Ca, Mg, Li, Na, Ni, Cr and As; wherein the silicon carbide has less than about 90 ppm total of the elements selected from the group consisting of Al, Fe, B, P, Mg, Li, V, Ce, Cr, and S; wherein the silicon carbide has less than about 90 ppm total of the elements selected from the group consisting of Al, Fe, B, and P; wherein the silicon carbide has less than about 90 ppm total of the elements selected from the group consisting of Ti, Al, Fe, B, P, Pt, Ca, Ce, Cr, S and As; wherein the silicon carbide has less than about 90 ppm total of the elements selected from the group consisting of Ti, Fe, P, Pt, Ca, Mg, Li, Na, Ni, Cr and As; wherein the silicon carbide has less than about 90 ppm total of the elements selected from the group consisting of Al, Fe, B, P, Mg, Li, V, Ce, Cr, and S; and, wherein silicon carbide is produced and wherein the silicon carbide is at least 99.9999% pure; and the silicon carbide is beta type.

Accordingly there is provided a a high purity polymer derived ceramic SiC composition, the composition including: an $SiC_4$ configuration; the composition defining a surface, wherein the composition surface is resistant to oxidation under standard ambient temperature and pressure, whereby the surface is essentially free of an oxide layer at standard ambient temperature and pressure; and, wherein the composition is substantially free from impurities, whereby total impurities are less than 1 ppm.

There is provided methods, composition and articles having one or more of the following features: wherein the $SiC_4$ configuration is selected from the group consisting of cube structures and tetrahedral structures; wherein the $SiC_4$ configuration is selected from the group consisting of hexagonal, rhombohedral, and trigonal structures; wherein the $SiC_4$ configuration is selected from the group consisting of 3C-SiC, β-SiC, 2H-SiC, 4H-SiC, 6H-SiC, 8H, 10H, 16H, 18H, 19H, 15R, 21R, 24H, 33R, 39R, 27R, 48H, and 51R; wherein the $SiC_4$ configuration is selected from the group consisting of a stacking sequence of ABCABC, a stacking sequence of ABAB, a stacking sequence of ABCBABCB, and a stacking sequence of ABCACBABCACB.

Still further there is provided a semiconductor including an SiC wafer made from the high purity polymer derived ceramic SiC composition having a band gap, wherein the band gap is from about 2.26 eV to about 3.33 eV.

Additionally there is provided a semiconductor including an SiC wafer made from the high purity polymer derived ceramic SiC composition having a band gap, wherein the band gap is greater than about 2.20 eV.

Further there is provided a semiconductor including an SiC wafer made from the high purity polymer derived ceramic SiC composition having a band gap, wherein the band gap is from about 2.26 eV to about 3.33 eV.

Yet further there is provided a power device including an SiC wafer made from the high purity polymer derived ceramic SiC composition having an $E_{max}$, wherein the $E_{max}$ is greater than about 1 MV/cm.

Additionally there is provided a power device including an SiC wafer made from the high purity polymer derived ceramic SiC composition having an $E_{max}$, wherein the $E_{max}$ is greater than about 1.5 MV/cm.

Yet further there is provided a power device including an SiC wafer made from the high purity polymer derived ceramic SiC composition having an $E_{max}$, wherein the $E_{max}$ is greater than about 2 MV/cm.

Furthermore, there is provided a power device including an SiC wafer made from the high purity polymer derived ceramic SiC composition having an $E_{max}$, wherein the $E_{max}$ is greater than about 2.5 MV/cm.

Moreover, there is provided a high frequency device including an SiC wafer made from the high purity polymer derived ceramic SiC composition having a saturation drift velocity of $2 \times 10^7$ cm/sec$^2$.

Still further there is provided an article made from the high purity polymer derived ceramic SiC composition having a thermal conductivity, the thermal conductivity being greater than about 4.0 W/(cm-K) at room temperature.

Still additionally there is provided an article made from the high purity polymer derived ceramic SiC composition having a thermal conductivity, the thermal conductivity being greater than about 4.5 W/(cm-K) at room temperature.

Still additionally there are provided methods, compositions and articles having one or more of the following features: wherein the volumetric shape defines a surface, wherein the surface is essentially free of an oxide layer; wherein the volumetric shape is selected from the group of shapes consisting of pucks, briquettes, bricks, pellets, discs, pills and tablets; wherein the volumetric shape is selected from the group of shapes consisting of pucks, briquettes, bricks, pellets, discs, pills and tablets; wherein the volumetric shape elastic modules is less than about 100 GPa, and a compressive strength of less than about 1,000 MPa; wherein the volumetric shape elastic modules is less than about 100 GPa, and a compressive strength of less than about 1,000 MPa; wherein the volumetric shape elastic modules is less than about 10 GPa, and a compressive strength of less than about 500 MPa; wherein the volumetric shape elastic modules is less than about 10 GPa, and a compressive strength of less than about 500 MPa; a friable mass wherein the impurities are less than about 1 ppm; a friable mass wherein the $SiC_4$ configuration is selected from the group consisting of cube structures and tetrahedral structures; a friable mass wherein the $SiC_4$ configuration is selected from the group consisting of hexagonal, rhombohedral, and trigonal structures; a friable mass wherein the $SiC_4$ configuration is selected from the group consisting of 3C-SiC, β-SiC, 2H-SiC, 4H-SiC, 6H-SiC, 8H, 10H, 16H, 18H, 19H, 15R, 21R, 24H, 33R, 39R, 27R, 48H, and 51R; a friable mass wherein the $SiC_4$ configuration is selected from the group consisting of a stacking sequence of ABCABC, a stacking sequence of ABAB, a stacking sequence of ABCBABCB, and a stacking sequence of ABCACBABCACB; and a friable mass wherein the $SiC_4$ configuration is selected from the group consisting of a stacking sequence of ABCABC, a stacking sequence of ABAB, and a stacking sequence of ABCBABCB.

Yet further the is provided an epitaxial polysilocarb derived SiC layer on a substrate, wherein the epitaxial polysilocarb derived SiC layer is made from: a high purity polymer derived ceramic SiC composition including: an $SiC_4$ configuration; the composition defining a surface, wherein the composition surface is resistant to oxidation under standard ambient temperature and pressure, whereby the surface is essentially free of an oxide layer at standard ambient temperature and pressure; and, wherein the composition is substantially free from impurities, whereby total impurities are less than 1 ppm; whereby the epitaxial polysilocarb derived SiC layer is substantially free from impurities having less than 1 ppm impurities.

There is yet further provided methods, compositions and articles having one or more of the following features: wherein the impurities are selected from the group consisting of Al, Fe, B, P, Pt, Ca, Mg, Li, Na, Ni, V, Ti, Ce, Cr, S and As; wherein the impurities are selected from the group consisting of Al, Fe, B, P, Pt, Ca, Mg, Li, Na, Ni, V, Ti, Ce, Cr, S and As; wherein the impurities are selected from the group consisting of Al, Fe, B, P and N; wherein the impurities are selected from the group consisting of Al, Fe, B, P and Na; wherein the impurities are selected from the group consisting of Al, Fe, B, P and Na; wherein the impurities are selected from the group consisting of Al, B, and P; wherein the substrate is comprised of SiC; and wherein the substrate is comprised of Si; wherein the substrate is comprised of a tie layer and SiOC.

Still further there is provided an epitaxial polysilocarb derived SiC layer on a substrate, wherein the epitaxial polysilocarb derived SiC layer is made from: a friable mass of high purity polymer derived ceramic SiC, including: polymer derived SiC granular particles, the particles including an $SiC_4$ configuration; the granular particles defining a volumetric shape; the granular particles having an actual density of about 3.0 g/cc to about 3.5 g/cc, an elastic modules of about 410 GPa, and a compressive strength of about 3,900 MPa; the volumetric shape having an apparent density of less than about 2.5 g/cc, an elastic modules of less than about 205 GPa, and a compressive strength of less than about 2,000 MPa; and, wherein the volumetric shape is substantially free from impurities, whereby total impurities, the impurities selected from the group consisting of Al, Fe, and B, are less than 10 ppm, Yet further there is provided a polysilocarb derived SiC boule, including: the polysilocarb derived SiC boule defining a length and a diameter, wherein the length is greater than about 1 inch and the diameter is greater than about 2 inches; wherein the polysilocarb derived SiC boule is made by the vapor deposition of a high purity polymer derived ceramic SiC composition including: an $SiC_4$ configuration; the composition defining a surface, wherein the composition surface is resistant to oxidation under standard ambient temperature and pressure, whereby the surface is essentially free of an oxide layer at standard ambient temperature and pressure; and, wherein the composition is substantially free from impurities, whereby total impurities are less than 1 ppm; whereby the polysilocarb derived SiC boule is substantially free from impurities having less than 1 ppm impurities, and is essentially free from micropipes.

Additionally there is provided methods, compositions and articles having one or more of the following features: a polysilocarb derived SiC boule wherein length is at least 3 inches; a polysilocarb derived SiC boule wherein length is at least 5 inches; a polysilocarb derived SiC boule wherein length is at least 8 inches; a polysilocarb derived SiC boule wherein length is at least 12 inches; a polysilocarb derived SiC boule wherein the diameter is at least 4 inches; a polysilocarb derived SiC boule wherein the diameter is at least 8 inches; a polysilocarb derived SiC boule wherein the diameter is at least 10 inches; a polysilocarb derived SiC boule wherein the diameter is at least 12 inches; a polysilocarb derived SiC boule wherein the diameter is at least 9 inches and the length is at least 4 inches; a polysilocarb derived SiC boule wherein the diameter is at least 10 inches and the length is at least 4 inches; a polysilocarb derived SiC boule wherein the diameter is at least 12 inches and the length is at least 4 inches; and, a polysilocarb derived SiC boule wherein the diameter is at least 11 inches and the length is at least 4 inches.

Still further there is provided a polysilocarb derived SiC boule, including: the polysilocarb derived SiC boule defining a length and a diameter, wherein the length is greater than about 1 inch and the diameter is greater than about 2 inches; wherein the polysilocarb derived SiC boule is made by the vapor deposition of a friable mass of high purity polymer derived ceramic SiC, the friable mass including: polymer derived SiC granular particles, the particles including an $SiC_4$ configuration; the granular particles defining a volumetric shape; the granular particles having an actual density of about 3.0 g/cc to about 3.5 g/cc, an elastic modules of about 410 GPa, and a compressive strength of about 3,900 MPa; and, the volumetric shape having an apparent density of less than about 2.0 g/cc, an elastic modules of less than about 100 GPa, and a compressive strength of less than about 1,000 MPa; wherein the volumetric shape is substantially free from impurities, whereby total impurities, the impurities selected from the group consisting of Al, Fe, B, P, Ca, Mg, Na, Ni, Cr, S and As, are less than 10 ppm; and, whereby the polysilocarb derived SiC boule is substantially free from micropipes.

There is still further provided polysilocarb derived SiC boules: wherein the boule has less than 5 micropipes/cm$^2$; wherein the boule has less than 1 micropipes/cm$^2$; wherein the boule has less than 0.5 micropipes/cm$^2$; and wherein the boule has less than 0.1 micropipes/cm$^2$.

Additionally there is provided a method of making a polysilocarb derived SiC boule, the polysilocarb derived SiC boule defining a length and a diameter, wherein the length is greater than about 1 inch and the diameter is greater than about 2 inches, the method including: wherein the polysilocarb derived SiC boule is made by the vapor deposition of a mass of high purity polymer derived ceramic SiC, the mass including: polymer derived SiC granular particles, the particles including an $SiC_4$ configuration; the granular particles defining a volumetric shape; the granular particles having an actual density of about 3.0 g/cc to about 3.5 g/cc, an elastic modules of about 410 Gpa, and a compressive strength of about 3,900 MPa; and, the volumetric shape having a bulk density of less than about 2.0 g/cc, an elastic modules of less than about 100 Gpa, and a compressive strength of less than about 1,000 MPa; wherein the volumetric shape is substantially free from impurities, whereby total impurities, the impurities selected from the group consisting of Al, Fe, and B, are less than 10 ppm; and, whereby the polysilocarb derived SiC boule has less than 1 micropipe/cm$^2$.

Moreover, there is provided a method of making a polysilocarb derived SiC boule, the polysilocarb derived SiC boule defining a length and a diameter, wherein the length is greater than about 1 inch and the diameter is greater than about 2 inches, the method including: wherein the polysilocarb derived SiC boule is made by the vapor deposition of a friable mass of high purity polymer derived ceramic SiC, the friable mass including: polymer derived SiC granular particles, the particles including an $SiC_4$ configuration; the granular particles defining a volumetric shape; the granular particles having an actual density of about 3.0 g/cc to about 3.5 g/cc, an elastic modules of about 410 GPa, and a compressive strength of about 3,900 MPa; and, the volumetric shape having an apparent density of less than about 2.0 g/cc, an elastic modules of less than about 100 GPa, and a compressive strength of less than about 1,000 MPa; wherein the volumetric shape is substantially free from impurities, whereby total impurities, the impurities selected from the group consisting of Al, Fe, B, P, Ca, Mg, Na, Ni, Cr, S and As, are less than 10 ppm; and, whereby the polysilocarb derived SiC boule is substantially free from micropipes.

Thus, there is provided a method of making a high purity silicon oxycarbide, the method including: distilling a liquid including silicon, carbon and oxygen; and, curing the liquid to a cured material; wherein cured material is at least 99.999% pure.

Thus, there is provide a method of making boule for the production of a silicon carbide wafer characterized with the properties of 2" 6H N-Type, 6H-N 2" dia, type/dopant:N/ nitrogen orientation:<0001>+/−0.5 degree, thickness: 330±25 um D Grade,MPDä100 cm-2, D Grade,RT:0.02-0.2 Ω·cm, the method including the steps of forming a vapor of a polymer derived ceramic SiC, the polymer derived ceramic having a purity of at least about 6 nines, and being oxide layer free, depositing the vapor on a seed crystal to form a boule, and providing the boule to a wafer manufacturing process.

Moreover, there are provided the methods, boules and wafer having one or more of the following features: wherein the seed comprises a polymer derived ceramic SiC; wherein the wafer making process produces a wafer having improved features, when compared to a wafer made from a non-polymer derived SiC material; and wherein the improved features are selected from the group consisting of bow, edge contour, flatness, focal plane, warp and site flatness.

Still further there is provided a method of making silicon carbide wafer, the method comprising the steps of forming a vapor of a polymer derived ceramic SiC, the polymer derived ceramic having a purity of at least about 6 nines, and being oxide layer free, depositing the vapor on a seed crystal to form a boule, and providing the boule to a wafer manufacturing process.

Additionally, there is provided a method of making a wafer from polymer derived ceramic starting materials wherein the wafer is characterized with the properties of 2" to 10" 6H N-Type.

Yet further there is provided a method of making boule for the production of a silicon carbide wafer characterized with the properties of 4H-N 2" to 10" dia, type/dopant:N/nitrogen orientation:<0001>+/−0.5 degree, thickness:330±25 um B Grade,MPDä30 cm-2 B Grade:RT:0.01-0.1 Ω·cm B Grade, Bow/Warp/TTV<25 um, the method including the steps of forming a vapor of a polymer derived ceramic SiC, the polymer derived ceramic having a purity of at least about 6 nines, and being oxide layer free, depositing the vapor on a seed crystal to form a boule, and providing the boule to a wafer manufacturing process.

Thus, there is provide a method of making boule for the production of a silicon carbide wafer characterized with the properties of 2" 6H N-Type, 6H-N 2" dia, type/dopant:N/ nitrogen orientation:<0001>+/−0.5 degree, thickness: 330±25 um D Grade,MPDä100 cm-2, D Grade,RT:0.02-0.2 Ω·cm, the method including the steps of forming a vapor of a polymer derived ceramic SiC, the polymer derived ceramic having a purity of at least about 6 nines, depositing the vapor on a seed crystal to form a boule, and providing the boule to a wafer manufacturing process.

Still further there is provided a method of making silicon carbide wafer, the method comprising the steps of forming a vapor of a polymer derived ceramic SiC, the polymer derived ceramic having a purity of at least about 6 nines, depositing the vapor on a seed crystal to form a boule, and providing the boule to a wafer manufacturing process.

DESCRIPTION OF THE PREFERRED EMBODIMENTS

Figure 1:
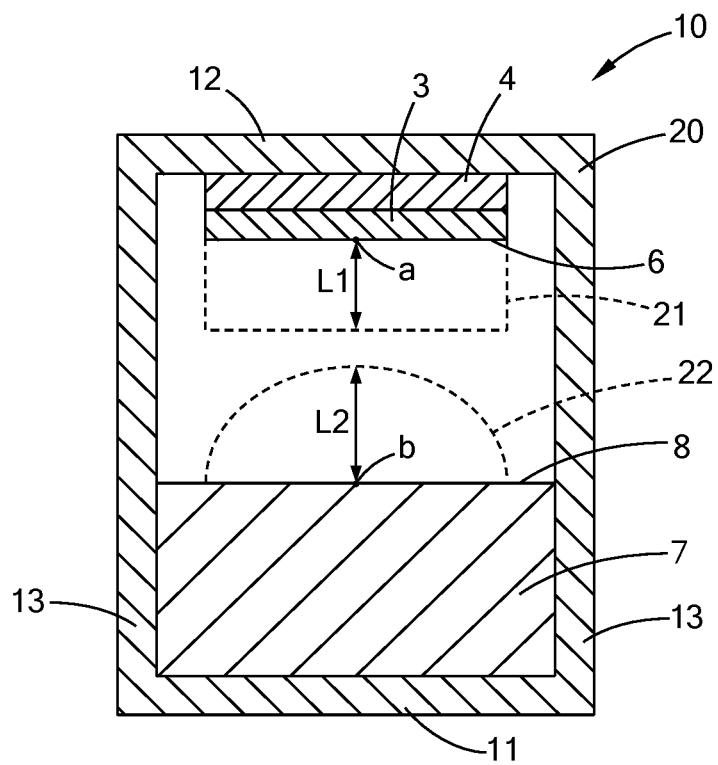
FIG. 1 is a schematic cross sectional diagram of a vapor deposition apparatus utilizing ultra pure SiC or SiOC materials in accordance with the present inventions.

In general, the present inventions relate to vapor deposition techniques and apparatus using polysilocarb (SiOC) and Silicon Carbide (SiC) materials having good, high, and exceedingly high purity.

Examples of vapor deposition techniques and apparatus include, for example, CVD generally refers to Chemical Vapor Deposition. CVD is a type of vapor deposition technology. In addition to CVD, vapor deposition technologies would include PVD (Physical Vapor Deposition), plasma enhanced CVD, Physical Vapor Transport (PVT) and others.

Generally, the present inventions are directed toward "polysilocarb" materials, e.g., material containing silicon (Si), oxygen (O) and carbon (C), and materials that have been converted to various forms of SiC from such materials. Polysilocarb materials may also contain other elements. Polysilocarb materials are made from one or more polysilocarb precursor formulation or precursor formulation. The polysilocarb precursor formulation contains one or more functionalized silicon polymers, or monomers, as well as, potentially other ingredients, such as for example, inhibitors, catalysts, initiators, modifiers, dopants, and combinations and variations of these and other materials and additives. Silicon oxycarbide materials, or SiOC compositions and similar terms, unless specifically stated otherwise, refer to polysilocarb materials that have have been cured into a plastic, or solid material containing Si, O and C, and polysilocarb materials that have been pyrolized into a ceramic material containing Si, O and C.

Typically, and preferably, the polysilocarb precursor formulation is initially a liquid. This liquid polysilocarb precursor formulation is then cured to form a solid or semi-sold material, e.g., a plastic. The polysilocarb precursor formulation may be processed through an initial cure, to provide a partially cured material, which may also be referred to, for example, as a preform, green material, or green cure (not implying anything about the material's color). The green material may then be further cured. Thus, one or more curing steps may be used. The material may be "end cured," i.e., being cured to that point at which the material has the necessary physical strength and other properties for its intended purpose. The amount of curing may be to a final cure (or "hard cure"), i.e., that point at which all, or essentially all, of the chemical reaction has stopped (as measured, for example, by the absence of reactive groups in the material, or the leveling off of the decrease in reactive groups over time). Thus, the material may be cured to varying degrees, depending upon its intended use and purpose. For example, in some situations the end cure and the hard cure may be the same.

The curing may be done at standard ambient temperature and pressure ("SATP", 1 atmosphere, 25° C.), at temperatures above or below that temperature, at pressures above or below that pressure, and over varying time periods (both continuous and cycled, e.g., heating followed by cooling and reheating), from less than a minute, to minutes, to hours, to days (or potentially longer), and in air, in liquid, or in a preselected atmosphere, e.g., Argon (Ar) or nitrogen ($N_2$).

Metal alkoxides may also be used to provide metal functionality to precursor formulations and products. Metal alkoxide compounds can be mixed with the Silicon precursor compounds and then treated with water to form the oxides at the same time as the polymer, copolymerize. This can also be done with metal halides and metal amides. Preferably, this may be done using early transition metals along with Aluminum, Gallium and Indium, later transition metals: Fe, Mn, Cu, and alkaline earth metals: Ca, Sr, Ba, Mg.

Compounds where Si is directly bonded to a metal center which is stabilized by halide or organic groups may also be utilized to provide metal functionality to precursor formulations and products.

Additionally, it should be understood that the metal and metal complexes may be the continuous phase after pyrolysis, or subsequent heat treatment. Formulations can be specifically designed to react with selected metals to in situ form metal carbides, oxides and other metal compounds, generally known as cermets (e.g., ceramic metallic compounds). The formulations can be reacted with selected metals to form in situ compounds such as mullite, alumino silicate, and others. The amount of metal relative to the amount of silica in the formulation or end product can be from about 0.1 mole % to 99.9 mole %, about 1 mole % or greater, about 10 mole % or greater, and about 20 mole percent or greater. The forgoing use of metals with the present precursor formulas can be used to control and provide predetermined stoichiometries.

The polysilocarb batch may also be used a binder in composite structures, such as a binder for metal, ceramic, and inorganic matrices.

As used herein, unless specified otherwise the terms %, weight % and mass % are used interchangeably and refer to the weight of a first component as a percentage of the weight of the total, e.g., formulation, mixture, material or product. As used herein, unless specified otherwise "volume %" and "% volume" and similar such terms refer to the volume of a first component as a percentage of the volume of the total, e.g., formulation, material or product.

At various points during the manufacturing process, the polysilocarb structures, intermediates and end products, and combinations and variations of these, may be machined, milled, molded, shaped, drilled or otherwise mechanically processed and shaped.

Custom and predetermined control of when chemical reactions occur in the various stages of the process from raw material to final end product can provide for reduced costs, increased process control, increased reliability, increased efficiency, enhanced product features, increased purity, and combinations and variation of these and other benefits. The sequencing of when chemical reactions take place can be based primarily upon the processing or making of precursors, and the processing or making of precursor formulations; and may also be based upon cure and pyrolysis conditions. Further, the custom and predetermined selection of these steps, formulations and conditions, can provide enhanced product and processing features through chemical reactions, molecular arrangements and rearrangements, and microstructure arrangements and rearrangements, that preferably have been predetermined and controlled.

The ability to start with a liquid material, e.g., the precursor batch, having essentially all of the building blocks, e.g., Si and C, needed to make SiC provides a significant advantage in controlling impurities, contamination, and in making high purity SiOC, which in turn can be converted to high purity SiC, or which can be made directly in a single combined process or step. Thus, embodiments of the present inventions provide for the formation of SiOC that is at least about 99.9% (3-nines), at least about 99.99% (4-nines), at least about 99.999% (5-nines), and least about 99.9999% (6-nines) and at least about 99.99999% (7-nines) or greater purity. Similarly, embodiments of the present inventions provide for the formation of SiC that is at least about 99.9% (3-nines), at least about 99.99% (4-nines), at least about 99.999% (5-nines), and least about 99.9999% (6-nines) and at least about 99.99999% (7-nines) or greater purity. These purity values are based upon the amount of SiOC, or SiC, as the case may be, verse all materials that are present or contained within a given sample of SiOC or SiC product.

Embodiments of the present polysilocarb derived SiC and processes, reduce the cost of providing high purity and ultra high purity SiC, while also increasing the purity obtained, e.g., lower cost high purity SiC materials. Thus, among other things, embodiments of the polysilocarb SiC materials and articles have reduced costs and enhanced features, when compared to prior SiC, SiOC and Si materials and products Thus, among other things, embodiments of the polysilocarb SiC materials and articles can replace SiC as well as Si materials and products in many applications, and have to ability to provide for new, additional and enhanced applications that were not obtainable with SiC and Si materials and products for technical, economic, and both, reasons.

Embodiments of polymer derived SiC wafers include, among others, about 2-inch diameter wafers and smaller, about 3-inch diameter wafers, about 4-inch diameter wafers, about 5-inch diameter wafers, about 6-inch diameter wafers, about 7-inch diameter wafers, about 12-inch diameter wafers and potentially larger, wafers having diameters from about 2 inches to about 8 inches, wafers having diameters from about 4 inches to about 6 inches, square shaped, round shaped, and other shapes, surface area per side of about 1 square inch, about 4 square inches, about 10 square inches and larger and smaller, a thickness of about 100 µm, a thickness of about 200 µm, a thickness of about 300 µm, a thickness of about 500 µm, a thickness of about 700 µm, a thickness from about 50 µm to about 800 µm, a thickness from about 100 µm to about 700 µm, a thickness from about 100 µm to about 400 µm, and larger and smaller thickness, and combinations and variations of these.

In embodiments of the present inventions the high purity SiC has low, very and low and below detection limits, amounts of materials that cause significant problems, or are viewed as impurities, in the later processing and manufacture of items, for example, boules, wafers, electronic components, optical components and other SiC based intermediate and end products.

Thus, polymer derived high purity SiC, and in particular polysilocarb derived high purity SiOC, as well as, the high purity SiC that the SiOC is converted into, has a purity of at least about 99.9%, at least about 99.99%, at least about 99.999%, and least about 99.9999% and at least about 99.99999% or greater. Further, it is noted that embodiments of the present invention include polymer derived SiC, and SiOC, of any purity level, including lower levels of purity, such as 99.0%, 95%, 90% and lower. It is believe that these lower, e.g., non-high, purity embodiments have, and will find, substantial uses and applications. Similarly, it is believed that embodiments of the high purity SiC will find applications, uses, and provide new and surprising benefits to applications that prior to the present inventions were restricted to Si or materials other than SiC.

Embodiments of the present inventions include the use of high purity SiC in making wafers for applications in electronics and semiconductor applications. In both the vapor deposition apparatus and processes to create the boules and wafers for later use, high purity SiC is required. In particular, as set forth in Table 3, embodiments of high purity polymer derived SiOC and SiC can preferably have low levels of one, more than one, and all elements in Table 3, which in certain vapor deposition apparatus, electronics applications, and semiconductor applications are considered to be impurities. Thus, embodiments of polysilocarb derived SiC can be free of impurities, substantially free of impurities, and contain some but have no more than the amounts, and combinations of amounts, set out in Table 3.

TABLE 3

| Element | less than ppm | less than ppm | less than ppm | less than ppm | less than ppm |
| --- | --- | --- | --- | --- | --- |
| Al | 1,000 | 100 | 10 | 1 | 0.1 |
| Fe | 1,000 | 100 | 10 | 1 | 0.1 |
| B | 1,000 | 100 | 10 | 1 | 0.1 |
| P | 1,000 | 100 | 10 | 1 | 0.1 |
| Pt | 1,000 | 100 | 10 | 1 | 0.1 |
| Ca | 1,000 | 100 | 10 | 1 | 0.1 |
| Mg | 1,000 | 100 | 10 | 1 | 0.1 |
| Li | 1,000 | 100 | 10 | 1 | 0.1 |
| Na | 1,000 | 100 | 10 | 1 | 0.1 |
| Ni | 1,000 | 100 | 10 | 1 | 0.1 |
| V | 1,000 | 100 | 10 | 1 | 0.1 |
| Ti | 1,000 | 100 | 10 | 1 | 0.1 |
| Ce | 1,000 | 100 | 10 | 1 | 0.1 |
| Cr | 1,000 | 100 | 10 | 1 | 0.1 |
| S | 1,000 | 100 | 10 | 1 | 0.1 |
| As | 1,000 | 100 | 10 | 1 | 0.1 |
| Total of one or more of the above | 3,000 | 500 | 50 | 10 | 1 |

In an embodiment, Pr may also be considered an impurity in some applications and if so consider the limits and amounts of table 3 may be applicable to Pr.

Unless specified otherwise, as used herein, when reference is made to purity levels, high purity, % purity, % impurities, and similar such terms, excess carbon, i.e., beyond stoichiometric SiC, is not included, referenced to, considered, or used in the calculations or characterization of the material. In some applications excess carbon may have little to no effect on the application or product, and thus, would not be considered an impurity. In other applications excess carbon may be beneficial, e.g., carbon can act as a sintering aid; excess carbon can be used to address and compensate for irregularities in vapor deposition apparatus and processes.

In applications where nitrogen is viewed as a contaminate, embodiments of polysilocarb derived SiC and SiOC can have less than about 1000 ppm, less than about 100 ppm, less than about 10 ppm, less than about 1 ppm and less than about 0.1 ppm nitrogen, and lower.

In an embodiment of the polysilocarb derived SiC it is essentially free from, and free from the presence of Oxygen, in any form, either bound to Si or C or as an oxide layer. Thus, embodiments of polysilocarb derived SiC can have less than about 1000 ppm, less than about 100 ppm, less than about 10 ppm, less than about 1 ppm, and less than about 0.1 ppm oxygen, and lower. The polysilocarb derived SiC has the ability to resist, and does not form an oxide layer when exposed to air under standard temperatures and pressures. The absence of an oxide layer, i.e., oxide layer free SiC, under when stored under ambient conditions provides advantages in later manufacturing processes, where oxide layers can be viewed as an impurity, or otherwise a detriment to the manufacturing process.

Embodiments of polysilocarb derived SiC are highly versatile materials. They can have several forms, e.g., amorphous, crystalline having many different polytypes, and forming single (or mono-) and polycrystalline structures. One, more than one, and combinations of these various forms, many be in a single batch, volumetric shape, or sample of polysilocarb derived SiC. Thus, the present polysilocarb derived SiC materials finds applications in among other things, abrasives, friction members, optics, ballistic and impact resistant materials, insulation, and electronics.

Polysilocarb derived SiC powder, fines, pellets, or other smaller sized and shaped forms, can be joined together by way of a sintering operation to form component parts and structures.

The joining together, e.g., pressing, sintering, ready-to-press, of embodiments of the present polymer derived SiC can be done in any conventional process, and can be done with the use of sintering aids and other additives that are presently used in conventional processes. Embodiments of the present ultra pure polymer derived SiC provide unique, and believed to be never before present in an SiC, abilities to have their particles joined together without the need for any sintering aids, or processing additives. Thus, embodiments of the present ultra pure SiC are self-sintering, being that they do not require the presence of any sintering aids or additives in order to be joined or otherwise formed, e.g., sintered or pressed, into a solid and preferably monolithic solid shape. The self-sintered ultra pure SiC shapes can be significantly stronger than a corresponding shape that was made with the use of sintering aids. Thus, the self-sintered SiC shape can be 2×, 3×, 4× or more stronger than a similar SiC shape that used sintering aids. It being theorized that the sintering aids are forming bonds or junctures between the SiC particles and that these sintering aid junctures are substantially weaker than the SiC-to-SiC junctures, e.g., direct junctures, in the self-sintered shape.

Embodiments of the present polymer derived SiC, and in particular ultra pure SiC, through vapor deposition processes, crystalline growth processes, joining processes and other processes, can find applications and utilizations in among other things, broad band amplifiers, military communications, radar, telecom, data link and tactical data links, satcom and point-to-point radio power electronics, LED, lasers, lighting and sensors. Additionally, these embodiments can find applications and uses in transistors, such High-electron-mobility transistors (HEMT), including HEMT-based monolithic microwave integrated circuit (MMIC). These transistors can employ a distributed (traveling-wave) amplifier design approach, and with SiC's greater band gap, enabling extremely wide bandwidths to be achieved in a small footprint. Thus, embodiments of the present inventions would include these devices and articles that are made from or otherwise based upon polymer derived SiC.

Embodiments of the present polymer derived SiC, and in particular ultra pure SiC, through vapor deposition processes, crystalline growth processes, joining processes and other processes, can also find applications and utilizations in among other things, brake rotors and assemblies, brake disks and pads, to make gemstones and semiprecious stones, jewelry, moissanite, and cutting and abrasive applications. Thus, embodiments of the present inventions would include these devices and articles that are made from or otherwise based upon polymer derived SiC.

Embodiments of the present polymer derived SiC, and in particular ultra pure SiC, can be combined with other ceramic power formulations to provide enhanced benefits, reduced costs and both to processes that uses these other ceramic powers. For example BN/SiC/ZrO2 composites, and blends with other refractory/engineering ceramic powders, e.g., AlN, BC, BN, Al2O3, ZrO2, C, SiC, WC, and SiN, to name a few are contemplated. Thus, embodiments of the present inventions would include these devices and articles that are made from or otherwise based upon polymer derived SiC. They may also be used in metal alloying applications, for example to make cermets, or other metallurgy blend and allows. For example they can be so combined to Ti, Fe, Ni and Co, to name a few. Thus, for example, they can form polymer derived SiC-Ti alloys, polymer derived SiC-ferrous alloys, polymer derived SiC-Ni alloys, and polymer derived SiC-Co alloys.

Embodiments of the present polymer derived SiC ceramic power formulations can be utilized in, for example, as a component of, or in the construction of: kiln furniture, furnace tubes, furnace belt links, furnace rollers, nozzles, bearings, corrosion resistant seals, crucibles, refractories, thermal protection systems, RAM-Jet/SCRAM-Jet or anything that flies above Mach 3, rockets, space shuttles, rocket nose-cones and leading edge impact protection systems, SiC/SiC reinforced composites, SiC/C reinforced composites, DC magnetron sputtering targets, thermocouple sheathing, pump seals, and valve sleeves.

Embodiments of the present polymer derived SiC, SiOC and in particular ultra pure SiC and SiOC, through vapor deposition processes, crystalline growth processes, joining processes and other processes can find application and utilization in multi-layer structures, such as, for example a layer on a substrate. This layer can be crystalline, monocrystalline, polycrystalline, or amorphous. There can be structures that have many varied layers, e.g., substrate layer, tie layer, SiC layer, SiOC layer, and other substances. In an embodiment sapphire can be used as a substrate for an epitaxial SiC layer. GaN can also be an acceptable substrate. A tie layer can be used to moderate the lattice mismatch between dissimilar crystalline lattice parameters. Thus, for example where SiOC is used as a substrate it can have a tie layer to support SiC, or GaN layer growth on it.

In an embodiment of this process, high purity, polymer derived SiC, and preferably very small sized, e.g., less than about 100 μm, less than about 10 μm, having a purity of at about 99.999%, preferably about 99.9999% and more preferably about 99.99999% can be sintered into optical components. These optical components can be transmissive to selected wavelengths, e.g., 360-800 nm. They can have indexes of refraction of about 2.65 in the visible spectrum. They can have good, and high optical properties, being free of aberrations, occlusions, and other optical defects. They posses the toughness (e.g., chemical resistance, abrasion resistance, temperature resistance, hardness, of SiC). Thus, for example, then can provide significant improvements to the windows, or clear members, e.g., screens, on cell phones, tablets, touch screens and the like. They may be used for the bodies of these devices as well. These polymer derived SiC windows can be particularly advantageous in demanding applications, where for example, there are harsh environmental or use conditions present. They can be used in many optical applications, including: the generation of light, e.g., lasers, laser diodes, or other light sources; the shaping and transmitting of light, e.g., optical fibers, windows, prisms, lens, optics, mirrors, and internal reflectance elements (e.g., blocks, prisms that rely upon internal reflection to direct the light).

In addition to UV, visible and IR light, the SiC optical components can find applications in over wavelengths of electromagnetic radiation, such as microwave, millimeter wave, x-ray, and high energy beams.

Embodiments of polysilocarb derived SiC, in particular high purity SiC, have many unique properties that, among other things, make them advantageous and desirable for use in the electronics, solar, and power transmission industries and applications. They can function as a semiconductor material that is very stable, and suitable for several demanding applications, including high power, high-frequency, high-temperature, and corrosive environments and uses.

Polymer derived SiC is a very hard material with a Young's modulus of 424 GPa. It is essentially chemically inert, and will not react with any materials at room temperature.

Further, prior to the present inventions, it was believe that it was essentially impossible, from all practical standpoints, to diffuse anything into silicon carbide, thus to the extent that dopants are required to be added to the material, they can be added by way of the precursor and thus be present in a controlled manner and amount for growth into a boule, or other structure. Embodiments of precursor formulations may have dopant, or complexes that carry and bind the dopant into the ceramic and then the converted SiC, so that upon vapor deposition process the dopant is available and in a usable form.

Additionally, dopants or other additives to provide custom or predetermined properties to wafers, layers and structures that are made from embodiments of the polymer derived SiC and SiOC can be used with, as a part of, or in conjunction with the present polymer derived materials. In these embodiments, such property enhancing additives would not be considered impurities, as they are intended to be in, necessary to have in, the end product. The property enhancing additives can be incorporated into the liquid precursor materials. Depending on the nature of the property enhancing additive, it may be a part of the precursor back done, it may be complexed, or part of a complex, to incorporate it into the liquid precursors, or it can be present in other forms that will enable it to survive (e.g., be in a form that lets it function as intended in the final material). The property enhancing additive can also be added as a coating to the SiC or SiOC powdered material, can be added as a vapor or gas during processing, or can be in powder form and mixed with the polymer derived SiC or SiOC particles, to name a few. Further, the form and manner in which the property enhancing additive is present, should preferably be such that it has minimal, and more preferably, no adverse effect on processing conditions, processing time, and quality of the end products. Thus, a polysilocarb derived SiC having greater than 5-nines purity, greater than 6-nines purity and greater than 7-nines purity can have amounts of a property enhancing additive present. These amounts can be from about 0.01% to about 50%, about 0.1% to about 5%, about 1% to about 10%, less than 25%, less than 20%, less than 10% and less than 1%, as well as greater and smaller amounts depending upon the additive and the predetermined properties it is intended to impart.

Figure 10:
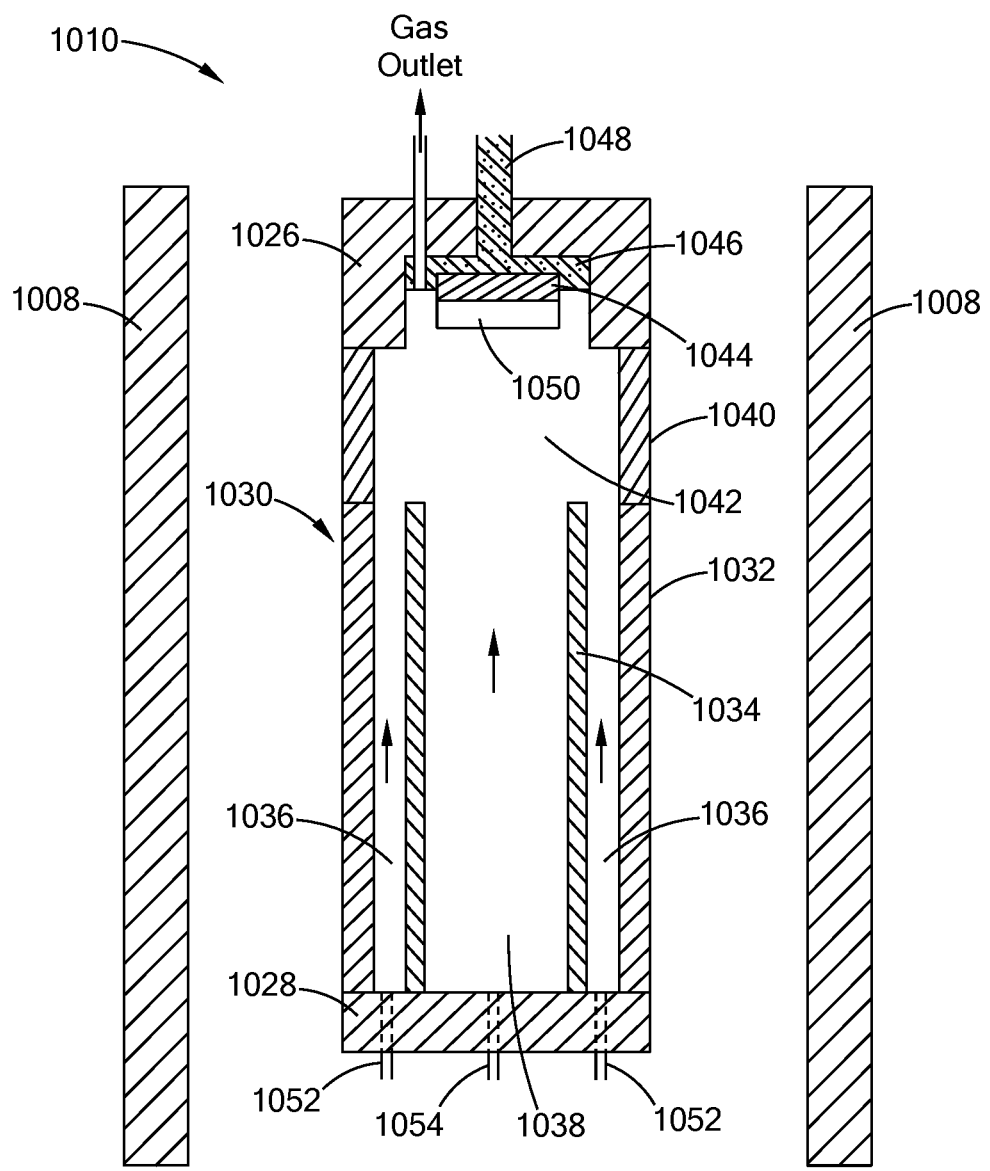
FIG. 10 is a schematic cross sectional diagram of a vapor deposition apparatus utilizing ultra pure SiC or SiOC materials in accordance with the present inventions.

Silicon carbide does not generally have a liquid phase, instead it sublimes, under vacuum, at temperatures above about 1,800° C. Turning to FIG. 10 there is provided a chart of a partial pressure curve for SiC. Typically, in industrial and commercial applications conditions are established so that the sublimation takes place at temperatures of about 2,500° C. and above. When Silicon carbide sublimes it typically forms a vapor consisting of Si, SiC, and $SiC_2$. Generally, it was believed that temperature determined the ratio of these different components in the Silicon carbide vapor. The present inventions, however, among other things, provide the capability to preselect and control the ratio of these components of a SiC vapor, for example by controlling the amount of excess carbon present in the polysilocarb derived SiC. Further, by varying, in a controlled manner, the porosity of the polysilocarb derived SiC, the amount of excess carbon present, and both (when used as a starting material in the vapor deposition process), for example, by having layers of SiC material having different predetermined amounts of excess carbon present, the make up of the Si C vapors can be varied in a controlled manner, and varied in a control manner over time.

Polysilocarb derived SiC, and the SiC boules, wafers and other structures that are made from the polysicocarb derived SiC, exhibit polymorphism, and generally a one dimensional polymorphism referred to as polytypism. Thus, polysilocarb derived SiC can be present in many, theoretically infinite, different polytypes. As used herein, unless expressly provided otherwise, the term polytypism, polytypes and similar such terms should be given their broadest possible meaning, and would include the various different frames, structures, or arrangements by which silicon carbide tetrahedrons ($SiC_4$) are configured. Generally, these polytypes fall into two categories—alpha ($\alpha$) and beta ($\beta$). FIGS. 2A and 2B, and 3A and 3B show the side and top view respectively of a single cubic and tetrahedral polymer derived SiC structure. Thus, in FIGS. 2A and B there are shown the single cubic arrangement of SiC, with Si being open circles, e.g., 200 and C being closed circles, e.g., 201. In FIGS. 3A and B there are shown the single tetrahedral arrangement of SiC, with Si being open circles, e.g., 300 and C being closed circles, e.g., 301.

Embodiments of the alpha category of polysilocarb derived SiC typically contains hexagonal (H), rhombohedral (R), trigonal (T) structures and may contain combinations of these. The beta category typically contains a cubic (C) or zincblende structure. Thus, for example, polytypes of polysilocarb derived silicon carbide would include: 3C-SiC ($\beta$-SiC or $\beta$3C-SiC), which has a stacking sequence of ABCABC . . . ; 2H-SiC, which has a stacking sequence of ABAB . . . ; 4H-SiC, which has a stacking sequence of ABCBABCB . . . ; and 6H-SiC (a common form of alpha silicon carbide, a 6H-SiC), which has a stacking sequence of ABCACBABCACB . . . . Examples, of other forms of alpha silicon carbide would include 8H, 10H, 16H, 18H, 19H, 15R, 21R, 24H, 33R, 39R, 27R, 48H, and 51R.

Embodiments of polysilocarb derived SiC may be polycrystalline or single (mono-) crystalline. Generally, in polycrystalline materials there are present grain boundaries as the interface between two grains, or crystallites of the materials. These grain boundaries can be between the same polytype having different orientations, or between different polytypes, having the same or different orientations, and combinations and variations of these. Mono-crystalline structures are made up of a single polytype and have essentially no grain boundaries.

Embodiments of the present inventions provide the ability to meet the demand for high purity silicon carbide, and in particular high purity single crystalline carbide materials for use in end products, such as a semiconductors. Thus, for these end products, and uses, which require high purity materials, it is desirable to have a low cost silicon carbide raw material that has a purity of at least about 99.9%, at least about 99.99%, at least about 99.999%, and least about 99.9999% and at least about 99.99999% or greater.

High purity single crystalline silicon carbide material has many desirable features and characteristics. For example, it is very hard having a Young's modulus of 424 GPa. Polycrystalline silicon carbide may also have very high hardness, depending upon its grain structure and other factors.

Embodiments of the present polysilocarb derived SiC would include the ability to provide larger diameter or cross section (e.g., about 5 inches, greater than 5 inches, about 6 inches, greater than 7 inches, about 8 inches, greater than 8 inches, greater than 9 inches, about 12 inches, and greater) seed crystals, boules and other structures. Such larger diameter or cross section structures can preferably have a purity of at least about 99.9%, at least about 99.99%, at least about 99.999%, and least about 99.9999% and at least about 99.99999% or greater.

Embodiments of the present inventions include articles, e.g., semiconductors, of silicon carbide having a band gap that varies by polytype between 2.39 eV for (beta SiC) 3C-SiC to 3.33 eV for 2H-SiC. 4H-SiC has a band gap of 3.265 eV. Alpha silicon carbide (6H-SiC) has a band gap of 3.023 eV. These band gaps are larger than for Si, which has a band gap of 1.11 eV. The high band gap allows silicon carbide materials to work in sensors, e.g., a gas sensor, that are operated in high temperature, e.g., up to about 1,000° C., environments. For example, a silicon carbide based gas sensor can have response times of only a few milliseconds while operating in temperatures of about 1,000° C.

Embodiments of materials made from polymer derived SiC, SiOC, and in particular high purity polymer derived SiC and SiOC, can be utilized in power devices and power device applications. For power device applications, the breakdown electric field strength $E_{max}$ can be an important property. This property quantizes how high the largest field in the material may be before material breakdown occurs (e.g., catastrophic breakdown). The $E_{max}$ is dependent upon doping levels, but in general for a SiC material and a Si material having the same doping levels the SiC $E_{max}$ can be on the order of 4 to 10 times greater. $E_{max}$ and relative $E_{max}$ can also be viewed from the perspective of the relative strengths of a device constructed to have the same blocking voltage. Thus, an Si device constructed for a blocking voltage of I kV would have a critical field strength of about 0.2 MV/cm, and a similar SiC device would have a critical field strength of about 2.49 MV/cm.

Embodiments of materials made from polymer derived SiC, SiOC, and in particular high purity polymer derived SiC and SiOC, can be utilized in high frequency devices and high frequency applications. Saturation drift velocity can be an important property for high frequency devices. Silicon carbide has a saturation drift velocity of $2 \times 10^7$ cm/sec$^2$, while a similar silicon's saturation drift velocity is about half of that. High saturation drift velocities are advantageous, if not necessary, for high-gain solid state devices. Thus, with embodiments of the present inventions providing high purity, low cost (e.g., cost effective) silicon carbide, it now can become a preferred choice from a materials perspective for such devices. However, it is believed that it was a choice that generally the art would not make, prior to the present inventions, because of the costs associated with utilizing silicon carbide; and the difficulty, if not impossibility in obtaining the needed purity.

Embodiments of materials made from polymer derived SiC, SiOC, and in particular high purity polymer derived SiC and SiOC, can be utilized in high thermal conductivity applications. The thermal conductivity of silicon carbide is higher than that of copper at room temperature, and it is believe may be superior to most if not all metals. For example the thermal conductivity of silver is 4.18 W/(cm-K), and of copper is 4.0 W/(cm-K) at room temperature. High purity silicon carbide can have thermal conductivity of greater than about 4.0 W/(cm-K), greater than about 4.5 W/(cm-K), about 4.9 W/(cm-K), and greater at room temperature.

Embodiments of the present inventions, and the advances in SiC processing and materials provided by the present inventions, can replace silicon materials, in many, the majority, if not essentially all electronics and other applications; as well as additional and new, applications and uses beyond conventional silicon based semiconductor and electrons applications.

Embodiments of polysilocarb derived high purity SiC, e.g., having a purity of at least about 99.9%, at least about 99.99%, at least about 99.999%, and least about 99.9999% and at least about 99.99999% or greater, can have many different polytypes. The polysilocarb derived high purity SiC and SiOC may be present as alpha (α), beta (β) and combinations and variations of these. Embodiments of the alpha category of polysilocarb derived high purity SiC typically contains hexagonal (H), rhombohedral (R), trigonal (T) structures and may contain combinations of these. The beta category of polysilocarb derived high purity SiC typically contains a cubic (C) or zincblende structure. Thus, for example, polytypes of polysilocarb derived high purity silicon carbide would include: 3C-SiC (β-SiC or β3C-SiC); 2H-SiC; 4H-SiC; and 6H-SiC (a common form of alpha silicon carbide, a 6H-SiC), which has a stacking sequence of ABCACBABCACB . . . . Examples, of other forms of alpha silicon carbide would include 8H, 10H, 16H, 18H, 19H, 15R, 21R, 24H, 33R, 39R, 27R, 48H, and 51R. Embodiments of polysilocarb-derived high purity SiC can be polycrystalline or single (mono-) crystalline. High purity SiOC, and SiOC derived SiC may be in an amorphous form.

Embodiments of the present inventions have the ability to provide, and are, high purity SiOC and SiC in the form of volumetric structures, e.g., pucks, briquettes, bricks, blocks, tablets, pills, plates, discs, squares, balls, rods, random shapes, etc. These volumetric shapes have a wide range of sizes, generally from about $1/16$ in$^3$ to about 1 ft$^3$, although larger and smaller volumes are contemplated. Embodiments of the volumetric structures can be very soft, and crumbly, or friable, preferably having the ability to fall apart with average hand pressure. Thus, these friable SiC volumetric structures can have: an elastic modulus of less than about 200 GPa, less than about 150 GPa, less than about 75 GPa, and less than about 10 GPa and smaller; a hardness of less than about 1,400 Kg/mm$^2$, less than about 800 Kg/mm$^2$, less than about 400 Kg/mm$^2$, less than about 100 Kg/mm$^2$ and smaller; and, compressive strength of less than about 1,850 MPa, of less than about 1,000 MPa of less than about 750 MPa, of less than about 200 MPa, of less than about 50 MPa, and smaller. Thus, these friable SiC volumetric shapes are substantially weaker than their underlying SiC material that makes up their structure, and which has reported values of elastic modulus of about 410 GPa, hardness of about 2,800 Kg/mm$^2$ and compressive strength of about 3,900 MPa. The actual density of the SiC, measured by Helium Pycnometry, is from about 3.0 to 3.5 g/cc, or about 3.1 to 3.4 g/cc, or about 3.2 to 3.3 g/cc. The apparent density, or specific gravity, for the friable volumetric shapes of SiC, e.g., pellets, pills, etc., may be significantly lower.

The mass of SiC (e.g., volumetric shape of the granular SiC particles, friable mass) preferably, and typically, has an apparent density that is considerably lower, than its actual density, e.g., actual density of an SiC granule should be about 3.1 g/cc to 3.3 g/cc. In general, and typically, the apparent and actual density of the granular SiC that is obtained from crushing the friable mass are essentially identical. The apparent density for the friable mass (e.g. a puck, pellet, disk or plate) can be less than about 3 g/cc, less than about 2 g/cc. less than about 1 g/cc and lower, and can be from about 0.5 g/cc to about 1.5 g/cc, about 0.4 g/cc to about 2 g/cc. The bulk density for particles of the SiC can be less than about 3.0 g/cc, less than about 2.0 g/cc, less than about 1 g/cc, and from about 0.1 g/cc to about 2 g/cc, 0.5 g/cc to about 1.5 g/cc. Greater and lower apparent densities and bulk densities are also contemplated. Moreover, specific, i.e., predetermined and precise, apparent densities for a friable mass of polymer derived SiC can be provided to match, and preferably enhance and more preferable optimize, later manufacturing processes. For example, in CVD wafer making, the friable mass of SiC granules can have an apparent density that is specifically designed and tailored to match a specific CVD apparatus. In this manner, each CVD apparatus in a facility can have custom feed stock, which enables each apparatus' performance to be optimized by the use of the feed stock (e.g., the friable mass of SiC) having a predetermined and precise apparent density.

The friable SiC volumetric shapes can thus be easily and quickly broken down into much smaller particles of SiC, having the typical strength characteristics of SiC. The smaller particles can be less than about 10 mm in diameter, less than about 1 mm in diameter, less than about 0.01 mm in diameter, less than about 100 μm (microns) in diameter, less than about 10 μm in diameter, and less than about 1 μm, less than about 500 nm (nanometers), to less than about 100 nm it being understood that smaller and larger sizes are contemplated.

Thus, embodiments of the present invention provide for the formation of a friable mass or volumetric shape of SiC, from a SiOC precursor, and from this friable mass of SiC obtain granular SiC. The granular SiC having significantly greater strength than the bulk properties of the friable mass of SiC. For example, the granular SiC can have an elastic modulus that is about 2× greater than the mass of SiC, about 3× greater than the mass of SiC, about 4× greater than the mass of SiC, and greater; the granular SiC can have a hardness that is about 2× greater than the mass of SiC, about 3× greater than the mass of SiC, about 4× greater than the mass of SiC, and greater; the granular SiC can have an compressive strength that is about 2× greater than the mass of SiC, about 3× greater than the mass of SiC, about 4× greater than the mass of SiC, and greater; and combinations and variation of these increased strength related features.

The friable mass of SiC that is obtained from for example the process of the embodiment of FIG. 1 (e.g., 103*c* of segment 108) can be reduced to granular SiC with crushing equipment such as a ball mill, an attrition mill, a rotor stator mill, a hammer mill, a jet-mill, a roller mill, a bead mill, a media mill, a grinder, a homogenizer, a two-plate mill, a dough mixer, and other types of grinding, milling and processing apparatus.

The friable mass of SiC has an inherent porosity to it. This porosity is preferably open hole, or substantially open hole porosity. In this manner, the friable mass typically provides substantially greater available surface area than granular SiC, because the granules are packed against one another. Thus, for example, if a friable discs of SiC were used in a vapor deposition process to make SiC boules (for subsequent conversion into SiC wafers), these friable SiC discs would provide substantially greater surface area from which to create SiC vapor, and substantially greater paths for movement of the SiC vapor, than could typically be obtained from using granular SiC in such a process. It is theorized that the increase surface area and the increased pathways, provides the ability to increase the rate of growth of the SiC boule, the quality of the SiC boule (and thus the subsequent wafers) and both of these. The friable SiC discs, e.g., the mass of SiC, may be easier to handle, measure, and use than the granular SiC material.

The friable mass of SiC preferably, and typically, has an apparent density that is considerably lower, than its actual density, e.g., actual density should be about 3.2 g/cc. In generally, the granular SiC, which is obtained from crushing the friable mass, has an apparent and actual density that are essentially identical, e.g., about 3.1 to 3.3 g/cc.

The force required to break up the friable mass of SiC to a granular form is minimal, compared to the force that was needed with conventional methods of making SiC (e.g., by carbothermal reduction of silica, Acheson type or based). The conventional methods, typically produce a batch of SiC in a monolith, having the strength of SiC, and which typically must be granulized, e.g., ground, cut, shaved, or milled, down to useful sizes. Thus, embodiments of the present inventions avoid the need for such heavy or robust grinding equipment to granulize the monolith of SiC. They further avoid the high cost of power, e.g., electricity, to operate such grinding equipment. They also greatly reduce the time need to granulize the SiC. It could take upwards of week(s), using this heaving grinding equipment, to granulize the monolith SiC to a useful size. While, an embodiment of the friable mass of SiC of the present inventions can be granulized in only a few hours, an hour, less than an hour, less than 30 minutes, a few minutes, and less. This grinding process for example can be, for example, post processing segment.

The features of the high purity polysicocarb SiC provide several advantages and benefits for use in, e.g., as the Si and C source or starting material, vapor deposition processes, systems and apparatus, among other techniques for growing or creating a SiC mass, structure, article or volumetric shape. These features include: the ability to have high purity levels, a high purity levels, the ability to control particle size distribution (shape, size and both); predetermined particle size distribution; the ability to have volumetric shapes; predetermined volumetric shapes (e.g., pucks, pills, discs, etc.); the ability to have porosity and control porosity; predetermined porosity; the ability to control the amount of carbon; predetermined carbon amounts (both excess, i.e., greater than stoichiometric, starved, i.e., less than stoichiometric and stoichiometric); and combinations and variations of these and other properties. While additional advantages for the present inventions may be seen, presently and by way of example, these advantages in vapor deposition processes would include shortening the time to grow the boule or other structure, longer run times before cleaning, the ability to optimize an apparatus, the ability to grow larger diameter boules or other structures, the ability to increase quality, the ability to reduce problematic areas, problematic regions or problematic occurrences (e.g., pipes, occlusions, imperfections) from the boule or other structure, reduced costs, greater control over the process, and combinations and variations of these.

It should be understood that the use of headings in this specification is for the purpose of clarity, and is not limiting in any way. Thus, the processes and disclosures described under a heading should be read in context with the entirely of this specification, including the various examples. The use of headings in this specification should not limit the scope of protection afford the present inventions.

Typically polymer derived ceramic precursor formulations, and in particular polysilocarb precursor formulations can generally be made by three types of processes, although other processes, and variations and combinations of these processes may be utilized. These processes generally involve combining precursors to form a precursor formulation. One type of process generally involves the mixing together of precursor materials in preferably a solvent free process with essentially no chemical reactions taking place, e.g., "the mixing process." The other type of process generally involves chemical reactions, e.g., "the reaction type process," to form specific, e.g., custom, precursor formulations, which could be monomers, dimers, trimers and polymers. A third type of process has a chemical reaction of two or more components in a solvent free environment, e.g., "the reaction blending type process." Generally, in the mixing process essentially all, and preferably all, of the chemical reactions take place during subsequent processing, such as during curing, pyrolysis and both.

It should be understood that these terms—reaction type process, reaction blending type process, and the mixing type process—are used for convenience and as a short hand reference. These terms are not, and should not be viewed as, limiting. For example, the reaction process can be used to create a precursor material that is then used in the mixing process with another precursor material.

These process types are described in this specification, among other places, under their respective headings. It should be understood that the teachings for one process, under one heading, and the teachings for the other processes, under the other headings, can be applicable to each other, as well as, being applicable to other sections, embodiments and teachings in this specification, and vice versa. The starting or precursor materials for one type of process may be used in the other type of processes. Further, it should be understood that the processes described under these headings should be read in context with the entirely of this specification, including the various examples and embodiments.

Preferred SiOC Derived SiC Curing and Pyrolysis

Preferably, in making SiC, and materials for use in making SiC, in a preferred embodiment the polysilocarb precursors can be mixed at about 1 atmosphere, in cleaned air.

Preferably, in making SiC, and materials for use in making SiC, the curing takes place at temperatures in the range of from about 20° C. to about 150° C., from about 75° C. to about 125° C. and from about 80° C. to 90° C. The curing is conducted over a time period that preferably results in a hard cured material. The curing can take place in air or an inert atmosphere, and preferably the curing takes place in an argon atmosphere at ambient pressure. Most preferably, for high purity materials, the furnace, containers, handling equipment, and other components of the curing apparatus are clean, essentially free from, and do not contribute any elements or materials, that would be considered impurities or contaminants, to the cured material.

Preferably, in making SiC, and materials for use in making SiC, the pyrolysis takes place at temperatures in the range of from about 800° C. to about 1300° C., from about 900° C. to about 1200° C. and from about 950° C. to 1150° C. The pyrolysis is conducted over a time period that preferably results in the complete pyrolysis of the preform. Preferably the pyrolysis takes place in inert gas, e.g., argon, and more preferably in flowing argon gas at or about at atmospheric pressure. The gas can flow from about 1,200 cc/min to about 200 cc/min, from about 800 cc/min to about 400 cc/min, and at about 500 cc/min. Preferably, an initial vacuum evacuation of the processing furnace is completed to a reduced pressure at least below 1E-3 Torr and re-pressurized to greater than 100 Torr with inert gas, e.g., Argon. More preferably, the vacuum evacuation is completed to a pressure below 1E-5 Torr prior to re-pressurizing with inert gas. The vacuum evacuation process can be completed anywhere from zero to >4 times before proceeding. Most preferably, for high purity materials, the furnace, containers, handling equipment, and other components of the curing apparatus are clean, essentially free from, free from and do not contribute any elements or materials, that would be considered impurities or contaminants, to the cured material.

In embodiments where low N and O levels are required, the use of a vacuum, preferably a turbopump, to achieve 10E-6 Torr and backfilling with inert gas is preferable. This purging process can be done once, or multiple times, to achieve low levels. A constant flow rate of "sweeping" gas can help purge the furnace during volatile generation.

Preferably, in making SiC, the ceramic SiOC is converted to SiC in subsequent or continued pyrolysis or conversion steps. The conversion step from SiOC may be a part of, e.g., continuous with, the pyrolysis of the SiOC preform, or it may be an entirely separate step in time, location and both. Depending upon the type of SiC desired the convention step can be carried out from about 1,200° C. to about 2,550° C. and from about 1,300° C. to 1,700° C. Generally, at temperatures from about 1,600° C. to 1900° C., the formation of beta types is favored over time. At temperatures above 1900° C., the formation of alpha types is favored over time. Preferably the conversion takes place in an inert gas, e.g., argon, and more preferably in flowing argon gas at or about at atmospheric pressure. The gas can flow from about 600 cc/min to about 10 cc/min, from about 300 cc/min to about 50 cc/min, and at about 80 cc/min to about 40 cc/min. Most preferably, for high purity materials, the furnace, containers, handling equipment, and other components of the curing apparatus are clean, essentially free from, and do not contribute any elements or materials, that would be considered impurities or contaminants, to the SiC.

The subsequent yields for SiOC derived SiC are generally from about 10% to 50%, typically from 30% to 40%, although higher and lower ranges may be obtained.

Most preferably, when making high purity SiC, the activities associated with making, curing, pyrolizing and converting the material are conducted in, under, clean room conditions, e.g., under an ISO 14644-1 clean room standard of at least ISO 5, of at least ISO 4, of at least ISO 3, of at least ISO 2, and at least ISO 1. In an embodiment the material handling steps are conducted in the cleanroom of at least ISO 5, while a less clean area (ISO>5) is used for the pyrolysis and conversion steps.

The use of ultra pure polymer derived SiC in vapor deposition techniques provides superior quality, and reduce defects in the boules, wafers and semiconductors that are made from these ultra pure polymer derived materials when compared to boules and wafers made from other sources of SiC, i.e., non-polymer derived ceramic based SiC. While not being bound by the present theory, it is believed that the polymer derived ceramic processes used to obtain ultra pure SiC from liquid SiOC starting materials, e.g., polysilocarb precursors, provides starting raw material SiC that has different features, and morphology, from other sources of SiC, which differences permit the polymer derived ceramic material to preform significantly better than other sources of SiC. When polymer derived ceramic SiC is used as a seed crystal it is believed that additional enhancements in boule and wafer qualities and efficiencies of manufacturing can be achieved over other SiC seed crystals. These benefits and improve features include enhancements and improvements, in at least the following properties and features and/or the reduction of at least the following deleterious properties or effects:

Bow—a measure of concave or convex deformation of the median surface of a wafer, independent of any thickness variation which may be present. Bow is determined at the center point of the wafer with respect to a reference plane determined by three points equally spaced on a circle whose diameter is 6.35 mm less than the nominal wafer diameter. Bow is a bulk properly of the wafer, not a property of an exposed surface. Generally, bow is determined with the wafer in a free, unclamped position. (Not to be confused with warp.)

Diameter—the linear distance across a circular silicon wafer which includes the wafer center and excludes any flats or other peripheral fiducial areas.

Edge contour—the cross sectional profile of a wafer edge shaped by grinding or etching. Edges may be either rounded or beveled.

Flatness—for wafer surfaces, the deviation of the front surface, expressed as TIR or maximum FPD, relative to a specified reference plane when the back surface of the wafer is ideally flat, as when pulled down by vacuum onto an ideally dean flat chuck. The flatness of a wafer may be described as: the global flatness; the maximum value of site flatness as measured on all sites: or the percentage of sites which have a site flatness equal to or less than a specified value.

Flatness quality area—that portion of the surface of a wafer over which the specified flatness values apply. The flatness quality area is most frequently defined with an edge exclusion area, a peripheral annulus usually 3 mm wide.

Focal plane—the plane perpendicular to the optical axis of an imaging system which contains the focal point of the imaging system.

Focal plane deviation (FPD)—the distance parallel to the optical axis from a point on the wafer surface to the focal plane. global flatness—the TIR or maximum FPD within the flatness quality area relative to a specified reference plane.

Maximum FPD—the largest of the absolute values of the focal plane deviations.

Primary flat—the flat of longest length which is oriented with respect to a specific crystallographic plane. Also known as major flat.

Reference plane—a plane specified by one of the following: three points at specified locations on the front surface of the wafer; the least squares fit to the front surface of the wafer using all points within the flasness quality area; the least squares fit to the front surface of the wafer using all points within a site; or an ideal back surface (equivalent to the ideally flat chuck surface that contacts the wafer).

Secondary flat(s)—the flat or flats of a length shorter than that of the primary flat whose angular position with respect to the primary flat identifies the conductivity type and orientation of the wafer. Also known as minor flat.

Site—a rectangular area, on the front surface of the wafer, whose sides are parallel with and perpendicular to the primary flat and whose center falls within the flatness quality area.

Site flatness—the TIR or maximum FPD of the portion of a site which falls within the flatness quality area.

Thickness—the distance through the wafer between corresponding points on the front and back surface.

otal indicator reading (TIR)—the smallest perpendicular distance between two planes, both parallel with the reference plane, which enclose all points within a specified flatness quality area or site on the front surface of a wafer.

Total thickness variation (TTV)—the difference between the maximum and minimum thickness values encountered during a scan pattern or a series of point measurements on a wafer.

Warp—ihe difference between ihe maximum and minimum distances of the median surface of the wafer from a reference plane encountered during a scan pattern. Warp is a bulk property of the wafer, not a property of an exposed surface. The median surface may contain regions with upward or downward curvature or both. Generally, warp is determined with the wafer in a free, unclamped position. (Not to be confused with bow.)

Utodoping—dopant, from sources other than the dopant intentionally added to the vapor phase, which is incorporated into an epitaxial layer during growth.

Autodoping barrier—a film or layer which impedes transport of impurity atoms from the back surface of a substrate to the epi layer during epitaxial deposition. Also known as backseal.

Conductivity type—defines the nature of the majority of the carriers in silicon: n-type material, in which electrons are the majority carrier, is formed when a donor dopant impurity is added to the silicon; p-type material, in which holes are the majority carrier, is formed when an acceptor dopant impurity is added to the silicon.

Crystal orientation—the crystallographic axis, on which the silicon crystal is grown.

Dislocation—a line imperfection in a crystal which forms the boundary between slipped and nonslipped regions of the crystal.

Dislocation density—the number of dislocation etch pits per unit area on an exposed wafer surface.

Dislocation etch pit—a sharply defined depression in the immediate region of a stressed or defective crystal lattice, resulting from preferential etching.

Dopant—a chemical element from the third (such as boron) or fifth (such as phosphorus or antimony) column of the periodic table, intentionally incorporated into a silicon crystal in trance amounts to establish its conductivity type and resistivity. P-Type Bor 0.001-50 ohmcm. N-Type Phosphorus 0.1-40 ohmcrn Antimony 0.005-0.025 ohmcm Arsenic <0.005 ohmcm.

Extrinsic gettering—controlled damage or stress to the crystal lattice structure intentionally introduced by mechanical means or by deposition of a polysilicon or other film on the back surface of a silicon wafer.

Flat orientation (primary)—the crystallographic plane, which ideally coincides with the surface of the primary flat, The primary flat is usually a <110> plane.

Miller indices—the reciprocals of the intercepts of a crystallographic plane with the x-, y-, and z-axes, respectively. For example, the cube face perpendicular to the x-axis is the <100> plane. A family of planes is denoted by curly brackets; e.g., all cube faces are the <100> planes. Directions are denoted by Miller indices in square brackets; e.g., the x-axis is the <100> direction an the cube diagonal is the <111> direction. Families of directions are denoted by angular brackets; e.g., all cubic axes are the <100> directions. A negative direction is denoted by a minus sign over the index: e.g., the negative x-axis is the <$\overline{\phantom{1}}$100> direction.

Polycrystalline silicon (polisilicon, poly)—silicon made up of randomly oriented crystallites and containing large-angle grain boundaries, twin boundaries, or both.

Radial oxygen variation—the difference between the average oxygen concentration at one or more points symmetrically located on a silicon wafer and the oxygen concentration at the center of the wafer, expressed as a percent of the concentration at the center. Unless otherwise specified, Siltec considers the radial oxygen variation to be determined using the average of the oxygen concentrations at the two points 10 mm from the edge of the wafer. Radial oxygen variation is sometimes determined using the average of the oxygen concentrations at several symmetric points half way between the center and the edge of the wafer. Also known as oxygen gradient.

Radial resistivity variation—the difference between the average resistivity at one or more points symmetrically located on a silicon wafer and the resistivity at the center of the wafer, expressed as a percent of the resistivity at the center, Unless otherwise specified, we consider the radial resistivity variation to be determined using the average resistivity of four points 6 mm from the edge of the wafer on two perpendicular diameters. Radial resistivity variation is sometimes determined using the average of the resistivity at the four point half way between the center and the edge of the wafer on the same diameters. Also known as resistivity gradient.

Resistivity (ohm·cm)—the ratio of the potential gradient (electric field) parallel with the current to the current density, In silicon, the resistivity is controlled by adding dopant impurities: lower resistivity is achieved by adding more dopant.

Slip—a process of plastic deformation in which one part of a crystal undergoes a shear displacement relative to another in a fashion which preserves the crystallinity of the silicon. After preferential etching, slip is evidenced by a pattern of one or more parallel straight lines of 10 or more dislocation etch pits per millimeter which do not necessarily toch each other. On <111> surfaces, groups of lines are inclined at 60° to each other; on <100> surfaces, they are inclined at 90° to each other.

Stacking fault—a two-dimensional defect resulting from a deviation from the normal stacking sequence of atoms in a crystal. It may be present in the bulk crystal, grow during epitaxial deposition (usually as a result of a contaminated or structurally imperfect substrate surface); or develop during oxydation. On <111> surfaces, stacking faults are revealed by preferential etching either as closed or partial equilateral triangles. On <100> surfaces, stacking faults are revealed as closed or partial squares.

Striations—helical features on the surface of a silicon wafer associated with local variations in impurity concentration. Such variations are ascribed to periodic differences in dopant incorporation occurring at the rotating solid-liquid interface during crystal growth. Striations are visible to the unaided eye after preferential etching and appear to be continuous under 100× magnification.

Subsurface damage—residual crystallographic imperfections apparent only after preferential etching of the polished silicon surface. Such damage is usually considered to be caused by mechanical processing of the wafer.

Twinned crystal—a crystal in which the lattice consists of two parts related to each other in orientation as mirror images across a coherent planar interface known as the twinning plane or twin boundary, In silicon, this plane is a <111> plane. Also known as twin.

Wafer orientation—the crystallographic plane, described in terms of Miller indices, with which the surface of the wafer is ideally coincident. Generally, the surface of the wafer corresponds within a few degrees with the low index plane perpendicular to the growth axis. In such cases, the orientation may also be described in terms of the angular deviation a of the low-index crystallographic plane from the polished wafer surface.

Chip—region where material has been removed from the surface or edge of the wafer. The size of a chip is defined by its maximum radial depth and peripheral chord length as measured on an orthographic shadow projection of the specimen outline. Also known as clamshell, conchoidal fracture, edge chip, flake, nick, peripheral chip, peripheral indent, and surface chip.

Contamination—a broad category of foreign matter visible to the unaided eye on the wafer surface. In most cases, it is removable by gas blow off, detergent wash, or chemical action. See also particulate contamination, stain.

rack—cleavage that extends to the surface of a wafer and which may or may not pass through the entire thickness of the wafer. Also known as fissure; see also fracture.

Cratering—a surface texture of irregular closed ridges with smooth central regions. crow's-foot—intersecting cracks in a pattern resembling a "crow's foot" (Y) on <111> surfaces and a cross (+) on <100> surfaces.

Dimple—a smooth surface depression, larger than 3 mm in diameter, on a wafer surface.

Fracture—a crack with single or multiple lines radiating from a point.

Groove—a shallow scratch with rounded edges, usually the remnant of a scratch not completely removed during polishing.

Haze—a cloudy or hazy appearance attributable to light scattering by concentrations of microscopic surface irregularities such as pits, mounds, small ridges or scratches, particles, etc.

Imbedded abrasive grains—abrasive particles mechanically forced into the surface of the silicon wafer. This type of contamination may occur during slicing, lapping, or polishing.

Indent—an edge defect that extends from the front surface to the back surface of the silicon wafer.

Light point defects (LPD)—individual fine points of reflected light seen when the wafer is illuminated by a narrow-beam light source held perpendicular to the wafer surface.

Mound—irregularly shaped projection with one or more facets. Mounds can be extensions of the bulk material or various forms of contamination, or both. A high density of mounds can also appear as haze.

Orange peel—a large-featured, roughened surface, similar to the skin of an orange, visible to the unaided eye under fluorescent light but not usually under narrow-beam illumination.

Particulate contamination—a form of contamination comprising particles, such as dust, lint, or other material resting on the surface of the wafer and standing out from the surface. May usually be blown off the surface with clean, dry nitrogen.

Pit—a depression in the surface where the sloped sides of the depression meet the wafer surface in a distinguishable manner (in contrast to the rounded sides of a dimple).

Saw blade defect—a roughened area visible after polishing with a pattern characteristic of the saw blade travel. It may be discernible before chemical polishing. Also known as saw mark.

Scratch—a shallow groove or cut below the established plane of the surface, with a length-to-width ratio greater than 5:1. A macroscratch is =0.12 μm in depth and is visible to the unaided eye under both incandescent (narrow-beam) and fluorescent illumination. A microscratch is <0.12 μm in depth and is not visible to the unaided eye under flourescent Spike—a tall, thin dendrite or crystalline filament which often occurs at the center of a recess in the surface of an epitaxial layer.

Stain—a form of contamination such as a streak, smudge, or spot which contains foreign chemical compounds such as organics or salts.

Wafers having the following features can be made with the polymer derived ultra pure SiC materials.

| Type | Description |
| --- | --- |
| 2" 6H N-Type | 6H—N 2" dia, Type/Dopant: N/Nitrogen<br>Orientation: <0001> +/− 0.5 degree<br>Thickness: 330 ± 25 um<br>D Grade, MPDä100 cm−2<br>D Grade, RT: 0.02-0.2 Ω · cm<br>Single face polished/Si face epi-ready with CMP,<br>Surface Roughness: <0.5 nm |
| 2" 6H N-Type | 6H—N 2" dia, Type/Dopant: N/Nitrogen<br>Orientation: <0001> +/− 0.5 degree<br>Thickness: 330 ± 25 um<br>B Grade, MPDä30 cm−2<br>B Grade, RT 0.02~0.2 Ω · cm<br>Single face polished/Si face epi-ready with CMP,<br>Surface Roughness: <0.5 nm |
| 2" 4H N-Type | 4H—N 2" dia, Type/Dopant: N/Nitrogen<br>Orientation: <0001> +/− 0.5 degree<br>Thickness: 330 ± 25 um<br>D Grade, MPDä100 cm−2<br>D Grade: RT: 0.01-0.1 Ω · cm<br>D Grade, Bow/Warp/TTV <25 um<br>Single face polished/Si face epi-ready with CMP,<br>Surface Roughness: <0.5 nm |
| 2" 4H N-Type | 4H—N 2" dia, Type/Dopant: N/Nitrogen<br>Orientation: <0001> +/− 0.5 degree<br>Thickness: 330 ± 25 um<br>B Grade, MPDä30 cm−2<br>B Grade: RT: 0.01-0.1 Ω · cm<br>B Grade, Bow/Warp/TTV <25 um<br>Single face polished/Si face epi-ready with CMP,<br>Surface Roughness: <0.5 nm |
| 3" 4H N-Type | 4H—N 3" dia, Type/Dopant: N/Nitrogen<br>Orientation: 4 degree +/− 0.5 degree<br>Thickness: 350 ± 25 um<br>D Grade, MPDä100 cm−2<br>D Grade, RT: 0.01-0.1 Ω · cm<br>D Grade, Bow/Warp/TTV <35 um<br>Double face polished/Si face epi-ready with CMP,<br>Surface Roughness: <0.5 nm |
| 3" 4H N-Type | 4H—N 3" dia, Type/Dopant: N/Nitrogen<br>Orientation: 4 degree +/− 0.5 degree<br>Thickness: 350 ± 25 um<br>B Grade, MPDä30 cm−2<br>B Grade, RT: 0.01-0.1 Ω · cm<br>B Grade, Bow/Warp/TTV <35 um<br>Double face polished/Si face epi-ready with CMP,<br>Surface Roughness: <0.5 nm |
| 3" 4H SI | 4H—SI 3" dia, Type/Dopant: Semi-insulating/V<br>Orientation: <0001> +/− 0.5 degree<br>Thickness: 350 ± 25 um<br>D Grade, MPDä100 cm−2<br>D Grade, RT: 70% ≥ 1E5 Ω · cm<br>Double face polished/Si face epi-ready with CMP,<br>Surface Roughness: <0.5 nm |
| 3" 4H SI | 4H—SI 3" dia, Type/Dopant: Semi-insulating/V<br>Orientation: <0001> +/− 0.5 degree<br>Thickness: 350 ± 25 um<br>B Grade, MPDä30 cm−2<br>B Grade, RT: 80% ≥ 1E5 Ω · cm<br>Double face polished/Si face epi-ready with CMP,<br>Surface Roughness: <0.5 nm |
| 2" 6H SI | 6H—SI 2" dia, Type/Dopant: Semi-insulating/V<br>Orientation: <0001> +/− 0.5 degree<br>Thickness: 330 ± 25 um<br>D Grade, MPDä100 cm−2<br>D Grade, RT: 70% ≥ 1E5 Ω · cm<br>Single face polished/Si face epi-ready with CMP,<br>Surface Roughness: <0.5 nm |
| 2" 6H SI | 6H—SI 2" dia, Type/Dopant: Semi-insulating/V<br>Orientation: <0001> +/− 0.5 degree<br>Thickness: 330 ± 25 um<br>B Grade, MPDä30 cm−2<br>B Grade, RT: 85% ≥ 1E5 Ω · cm<br>Single face polished/Si face epi-ready with CMP,<br>Surface Roughness: <0.5 nm |

-continued

| Type | Description |
|---|---|
| 4" 4H N-Type | 4H—N 4"dia.(100 mm ± 0.38 mm), Type/Dopant: N/Nitrogen<br>Orientation: 4.0° ± 0.5°<br>Thickness: 350 μm ± 25 μm<br>D Grade, MPDä100 cm−2<br>D Grade, 0.01~0.1 Ω · cm<br>D Grade, TTV/Bow/Warp <45 um<br>Double face polished/Si face epi-ready with CMP,<br>Surface Roughness: <0.5 nm |

SSP = Single Side Polished,
DSP = Double Side Polished,
E = Etched,
C = AsCut, Material - CZ unless noted,
L = Lapped,
Und = Undoped (Intrinsic)

This Group includes single crystal silicon grown by both the Czochralski (Cz) and Floating Zone (Fz) techniques The following examples are provided to illustrate various embodiments of, among other things, precursor formulations, processes, methods, apparatus, articles, compositions, and applications of the present inventions. These examples are for illustrative purposes, and should not be viewed as, and do not otherwise limit the scope of the present inventions. The percentages used in the examples, unless specified otherwise, are weight percent of the total batch, preform or structure.

EXAMPLES

Example 1

A polysilocarb formulation using the mixing type method is formulated. The formulation is made by mixing together, at room temperature, 41% MHF and 59% TV. This precursor formulation has 0.68 moles of hydride, 0.68 moles of vinyl, and 1.37 moles of methyl. The precursor formulation has the following molar amounts of Si, C and O based upon 100 g of formulation.

|  | Moles | Molar Ratio of Si, C, O (% of total moles in "Moles" Column) |
|---|---|---|
| Si | 1.37 | 25% |
| C | 2.74 | 50% |
| O | 1.37 | 25% |

As calculated, the SiOC derived from this formulation will have a calculated 1.37 moles of C after all CO has been removed, and has 0% excess C.

Example 2

A polysilocarb formulation using the mixing type method is formulated. The formulation is made by mixing together, at room temperature, 90% methyl terminated phenylethyl polysiloxane. (having 27% X) and 10% TV. This precursor formulation has 1.05 moles of hydride, 0.38 moles of vinyl, 0.26 moles of phenyl, and 1.17 moles of methyl. The precursor formulation has the following molar amounts of Si, C and O based upon 100 g of formulation.

|  | Moles | Molar Ratio of Si, C, O (% of total moles in "Moles" Column) |
|---|---|---|
| Si | 1.17 | 20% |
| C | 3.47 | 60% |
| O | 1.17 | 20% |

As calculated, the SiOC derived from this formulation will have a calculated 2.31 moles of C after all CO has been removed, and has 98% excess C.

Example 3

A polysilocarb formulation using the mixing type method is formulated. The formulation is made by mixing together at room temperature 70% methyl terminated phenylethyl polysiloxane (having 14% X) and 30% TV. This precursor formulation has 0.93 moles of hydride, 0.48 moles of vinyl, 0.13 moles of phenyl, and 1.28 moles of methyl. The precursor formulation has the following molar amounts of Si, C and O based upon 100 g of formulation.

|  | Moles | Molar Ratio of Si, C, O (% of total moles in "Moles" Column) |
|---|---|---|
| Si | 1.28 | 23% |
| C | 3.05 | 54% |
| O | 1.28 | 23% |

As calculated, the SiOC derived from this formulation will have a calculated 1.77 moles of C after all CO has been removed, and has 38% excess C.

Example 4

A polysilocarb formulation using the mixing type method is formulated. The formulation is made by mixing together at room temperature 50% methyl terminated phenylethyl polysiloxane (having 20% X) and 50% TV. This precursor formulation has 0.67 moles of hydride, 0.68 moles of vinyl, 0.10 moles of phenyl, and 1.25 moles of methyl. The precursor formulation has the following molar amounts of Si, C and O based upon 100 g of formulation.

|  | Moles | Molar Ratio of Si, C, O (% of total moles in "Moles" Column) |
|---|---|---|
| Si | 1.25 | 22% |
| C | 3.18 | 56% |
| O | 1.25 | 22% |

As calculated, the SiOC derived from this formulation will have a calculated 1.93 moles of C after all CO has been removed, and has 55% excess C.

Example 5

A polysilocarb formulation using the mixing type method is formulated. The formulation is made by mixing together at room temperature 65% methyl terminated phenylethyl polysiloxane (having 40% X) and 35% TV. This precursor formulation has 0.65 moles of hydride, 0.66 moles of vinyl, 0.25 moles of phenyl, and 1.06 moles of methyl. The precursor formulation has the following molar amounts of Si, C and O based upon 100 g of formulation.

|   | Moles | Molar Ratio of Si, C, O (% of total moles in "Moles" Column) |
|---|---|---|
| Si | 1.06 | 18% |
| C | 3.87 | 54% |
| O | 1.06 | 28% |

As calculated, the SiOC derived from this formulation will have a calculated 2.81 moles of C after all CO has been removed, and has 166% excess C.

Example 6

A polysilocarb formulation using the mixing type method is formulated. The formulation is made by mixing together at room temperature 65% MHF and 35% dicyclopentadiene (DCPD). This precursor formulation has 1.08 moles of hydride, 0.53 moles of vinyl, 0.0 moles of phenyl, and 1.08 moles of methyl. The precursor formulation has the following molar amounts of Si, C and O based upon 100 g of formulation.

|   | Moles | Molar Ratio of Si, C, O (% of total moles in "Moles" Column) |
|---|---|---|
| Si | 1.08 | 18% |
| C | 3.73 | 64% |
| O | 1.08 | 18% |

As calculated, the SiOC derived from this formulation will have a calculated 2.65 moles of C after all CO has been removed, and has 144% excess C.

Example 7

A polysilocarb formulation using the mixing type method is formulated. The formulation is made by mixing together at room temperature 82% MHF and 18% dicyclopentadiene (DCPD). This precursor formulation has 1.37 moles of hydride, 0.27 moles of vinyl, 0.0 moles of phenyl, and 1.37 moles of methyl. The precursor formulation has the following molar amounts of Si, C and O based upon 100 g of formulation.

|   | Moles | Molar Ratio of Si, C, O (% of total moles in "Moles" Column) |
|---|---|---|
| Si | 1.37 | 25% |
| C | 2.73 | 50% |
| O | 1.37 | 25% |

As calculated, the SiOC derived from this formulation will have a calculated 1.37 moles of C after all CO has been removed, and has 0% excess C.

Example 8

A polysilocarb formulation using the mixing type method is formulated. The formulation is made by mixing together at room temperature 46% MHF, 34% TV and 20% VT. This precursor formulation has 0.77 moles of hydride, 0.40 moles of vinyl, 0.0 moles of phenyl, and 1.43 moles of methyl. The precursor formulation has the following molar amounts of Si, C and O based upon 100 g of formulation.

|   | Moles | Molar Ratio of Si, C, O (% of total moles in "Moles" Column) |
|---|---|---|
| Si | 1.43 | 30% |
| C | 1.95 | 40% |
| O | 1.43 | 30% |

As calculated, the SiOC derived from this formulation will have a calculated 0.53 moles of C after all CO has been removed, and has a 63% C deficit, or is 63% C starved.

Example 9

A polysilocarb formulation using the mixing type method is formulated. The formulation is made by mixing together at room temperature 70% MHF, 20% TV and 10% VT. This precursor formulation has 1.17 moles of hydride, 0.23 moles of vinyl, 0.0 moles of phenyl, and 1.53 moles of methyl. The precursor formulation has the following molar amounts of Si, C and O based upon 100 g of formulation.

|   | Moles | Molar Ratio of Si, C, O (% of total moles in "Moles" Column) |
|---|---|---|
| Si | 1.53 | 31% |
| C | 1.87 | 38% |
| O | 1.53 | 31% |

As calculated, the SiOC derived from this formulation will have a calculated 0.33 moles of C after all CO has been removed, and has a 78% C deficit, or is 78% C starved.

Example 10

A polysilocarb formulation using the mixing type method is formulated. The formulation is made by mixing together at room temperature 95% MHF AND 5% TV.

Example 11

Figures 11, 12, 13:
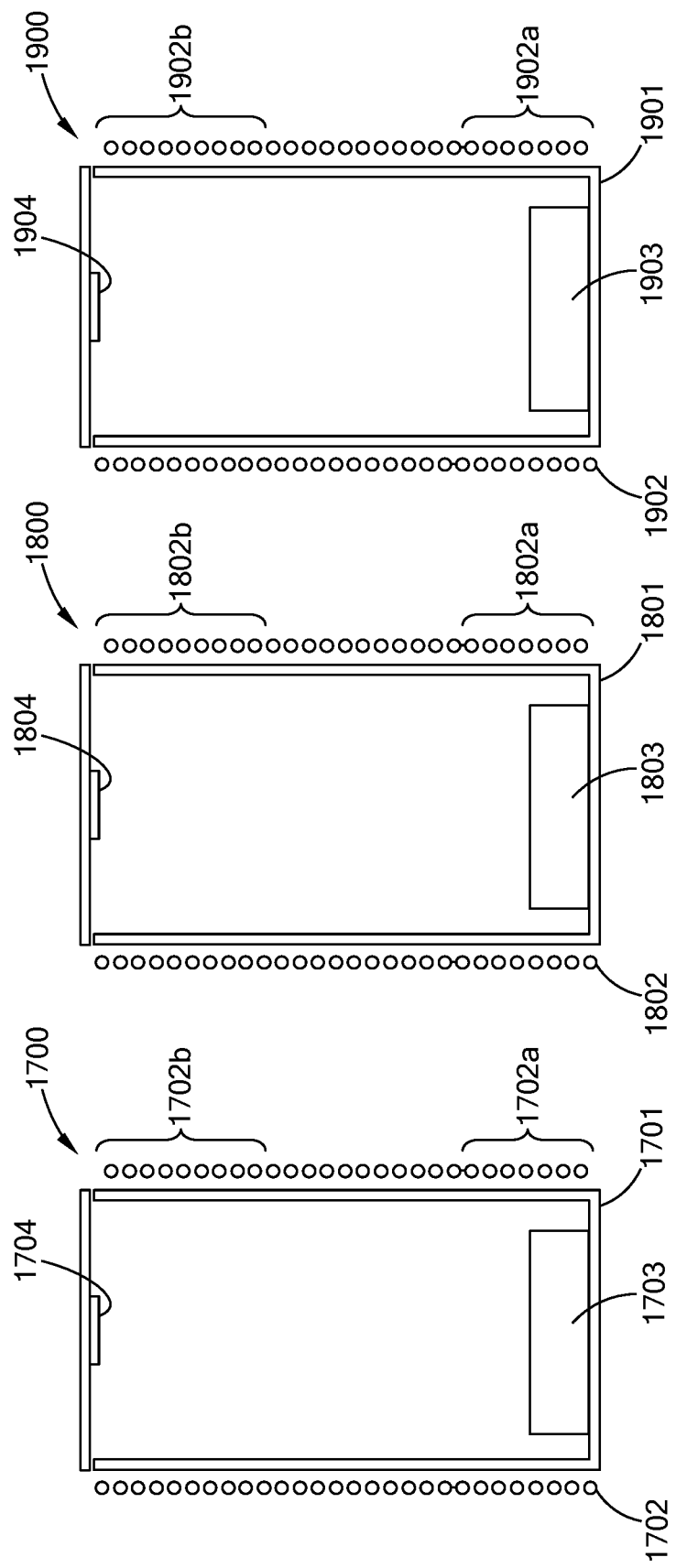
FIG. 11 is a schematic cross sectional diagram of a vapor deposition apparatus in accordance with the present inventions.
FIG. 12 is a schematic cross sectional diagram of a vapor deposition apparatus in accordance with the present inventions.
FIG. 13 is a schematic cross sectional diagram of a vapor deposition apparatus in accordance with the present inventions.
Figure 14:
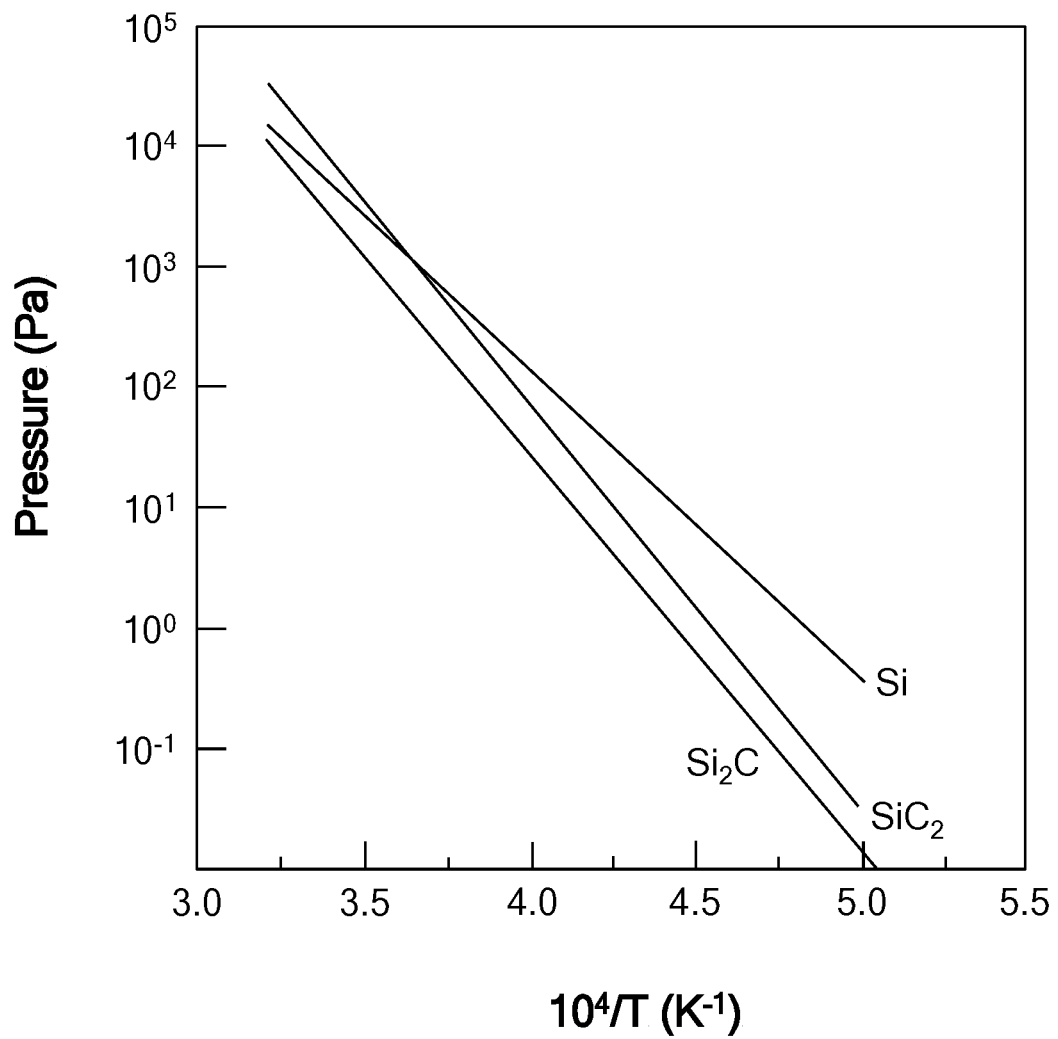
FIG. 14 a partial pressure cure for SiC, $Si_2C$, and $SiC_2$.

Turning to FIG. 11 there is shown a schematic cross sectional representation of an apparatus for growing SiC crystals and crystalline structures. The vapor deposition device 1700 has a vessel 1701 that is associated with, (e.g., thermally associated, positioned to deliver electromagnetic energy, has wrapped around it) various heating elements, e.g., 1702. The heating elements are configured and operated to provide at least two different temperature zones, Zone A, 1702a, and Zone B, 1702b. Inside of the vessel 1701 there is a polymer derived ceramic 1703, which is a source of Si and C. Additionally, inside the vessel 1701 is a crystal grown initiation article 1704.

Thus, in general the polymer derived ceramic 703 is heated to a temperature in Zone A 1702a to cause the SiC to sublimate, generally a temperature greater than about 2,000° C. The Si C vapors then rise into temperature Zone B, which is cooler than Zone A. The Si C vapors are deposited on the initiation article 704 as SiC.

It being understood that the schematic of the device 1700, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 11a

In the vapor deposition device 1701 the polymer derived ceramic 1703 is high purity SiOC. The temperature of Zone A is gradually increased and held at set temperatures to transition the SiOC to SiC and then to cause the SiC to sublimate and form an SiC crystal on the initiation article 1704.

Example 11b

In this example the initiation article 1704 is a seed crystal and the SiC that is deposited from the polymer derived SiC in Zone A form an alpha mono-crystalline boule. This boule is then sectioned to form polysilocarb derived SiC wafers.

Example 11c

In this example the initiation article 1704 is a Si substrate and the SiC from the polymer derived SiC in Zone A is deposited on the substrate as an epitaxial polysilocarb derived SiC layer on the Si substrate.

Example 11d

In the vapor deposition device 1701 the polymer derived ceramic 703 is high purity SiOC, having 6 nines purity. The temperature of Zone A is gradually increased and held at set temperatures to transition the SiOC to SiC and then to cause the SiC to sublimate and form an SiC crystal on the initiation article 1704.

Example 11e

In the vapor deposition device 1701 the polymer derived ceramic 703 is high purity SiOC, having less than 20 ppm Al. The temperature of Zone A is gradually increased and held at set temperatures to transition the SiOC to SiC and then to cause the SiC to sublimate and form an SiC crystal on the initiation article 1704.

Example 11f

In the vapor deposition device 1701 the polymer derived ceramic 1703 is high purity polysilocarb derived SiC, having less than 20 ppm Al. The SiC sublimates to form a SiC crystal on the initiation article 1704, which is a seed crystal.

Example 12

The vapor deposition device 1701 is a hot wall reactor.

Example 13

The vapor deposition device 1701 is a multiwafer reactor.

Example 14

The vapor deposition device 1701 is a chimney reactor.

Example 15

A boule of polysilocarb derived SiC having a length of about 1 inch and a diameter of about 4 inches. The boule is alpha type and is free from micropipes. The boule having less than 100, less than 10, and preferable no 1 micropores.

Example 15a

A boule of polysilocarb derived SiC has micropipe density of $<10/cm^2$, $<5/cm^2$, $<1/cm^2$, $<0.5/cm^2$ and most preferably $<0.1/cm^2$.

Example 16

A metal-semiconductor filed effect transistor (MESFET) is made from polysilocarb derived SiC. This MESFET is incorporated into compound semiconductor device, operating in the 45 GHz frequency range.

Example 17

A metal-semiconductor filed effect transistor (MESFET) is made from polysilocarb derived SiC. This MESFET is incorporated into a component of a cellular base station.

Example 18

A boule of polysilocarb derived SiC having a length of about 2 inches and a diameter of about 4 inches. The boule is doped to form p wafers for a semiconductor device.

Example 19

A boule of polysilocarb derived SiC having a length of about 2 inches and a diameter of about 4 inches. The boule is doped to form n wafers for a semiconductor device.

Example 20

Turning to FIG. 12 there is shown a schematic cross sectional representation of an apparatus for growing SiC crystals and crystalline structures. The vapor deposition device 1800 has a vessel 1801 that is associated with heat sources 1802. The heat sources, and vessel and heat sources, can be any of the assemblies described in this specification or that are know to the art. The heat sources are configured and operated to provide at least two different temperature zones, Zone A, 1802a, and Zone B, 1802b. Inside of the vessel 1801 there is a polymer derived ceramic 1803, which is a source of Si and C. The polymer derived ceramic 1803 is the polysilocarb of Example 6 that has been cured and transformed into SiC according to Example 14. Additionally, inside the vessel 1801 is a crystal grown initiation article 1804.

Thus, in general the polymer derived ceramic 803 is heated to a temperature in Zone A 1802a to cause the SiC to sublimate, generally a temperature greater than about 2,400° C. The Si C vapors then rise into temperature Zone B, which is cooler than Zone A. The Si C vapors are deposited on the initiation article 1804 as SiC.

It being understood that the schematic of the device 1800, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 21

Turning to FIG. 13 there is shown a schematic cross sectional representation of an apparatus for growing SiC crystals and crystalline structures. The vapor deposition device 1900 has a vessel 1901 that is associated with heat sources 1902. The heat sources, and vessel and heat sources, can be any of the assemblies described in this specification or that are know to the art. The heat sources are configured and operated to provide at least two different temperature zones, Zone A, 1902*a*, and Zone B, 1902*b*. Inside of the vessel 1901 there is a polymer derived ceramic 903, which is a source of Si and C. The polymer derived ceramic 1903 is the polysilocarb of Example 7 that has been cured and transformed into SiC according to Example 15. Additionally, inside the vessel 1901 is a crystal grown initiation article 1904.

Thus, in general the polymer derived ceramic 1903 is heated to a temperature in Zone A 1902*a* to cause the SiC to sublimate, generally a temperature about 2,500° C. The Si C vapors then rise into temperature Zone B, which is cooler than Zone A. The Si C vapors are deposited on the initiation article 1904 as SiC.

It being understood that the schematic of the device 1900, is a teaching illustration, greatly simplified, and that commercial and industrial devices can have additional components, such as control systems, monitors, gas handling and other devices and can also have different configurations, presently known to those of skill in the art, as well as, new devices and configurations that may be based, in part, upon the teachings of this specification.

Example 22

Ultra pure SiOC, of the formulations provided in this specification and having at least about 5-nines, and preferably about 6-nines purity, is used to make transparent SiOC articles in the processes disclosed and taught in U.S. Pat. No. 5,180,694, the entire disclosure of which is incorporated herein by reference.

Example 23

Ultra pure SiOC, of the formulations provided in this specification and having at least about 5-nines, and preferably about 6-nines purity is used to make SiOC layers and coatings on articles and in the processes disclosed and taught in U.S. Pat. No. 8,981,564, the entire disclosure of which is incorporated herein by reference.

Example 24

Ultra pure SiOC, of the formulations provided in this specification and having at least about 5-nines, and preferably about 6-nines purity is used to make SiOC layers and coatings on articles and in the processes disclosed and taught in U.S. Pat. No. 8,778,814, the entire disclosure of which is incorporated herein by reference.

Example 25

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, source material, growth material, deposition material or raw material, in the apparatus and processes taught and disclosed in US Patent Application Publication No. 2013/0255568 the entire disclosure of which is incorporated herein by reference.

A method for manufacturing silicon carbide single crystal having a diameter larger than 100 mm by sublimation includes the following steps. A seed substrate made of silicon carbide and silicon carbide raw material are prepared. Silicon carbide single crystal is grown on the growth face of the seed substrate by sublimating the silicon carbide raw material. In the step of growing silicon carbide single crystal, the maximum growing rate of the silicon carbide single crystal growing on the growth face of the seed substrate is greater than the maximum growing rate of the silicon carbide crystal growing on the surface of the silicon carbide raw material. Thus, there can be provided a method for manufacturing silicon carbide single crystal allowing a thick silicon carbide single crystal film to be obtained, when silicon carbide single crystal having a diameter larger than 100 mm is grown.

A method for manufacturing silicon carbide crystal of the present embodiment is directed to manufacturing silicon carbide single crystal having a diameter larger than 100 mm by sublimation. The method includes the following steps. A seed substrate made of silicon carbide and silicon carbide raw material are prepared. Silicon carbide single crystal is grown on the growth face of the seed substrate by sublimating the silicon carbide raw material. In the step of growing silicon carbide single crystal, the maximum growing rate of the silicon carbide single crystal growing on the growth face of the seed substrate is greater than the maximum growing rate of the silicon carbide crystal growing on the surface of the silicon carbide raw material.

Referring to FIG. 1, the seed substrate and silicon carbide raw material preparation step is carried out. Specifically, silicon carbide raw material 7 is placed in a crucible 20. A seed substrate 3 is arranged at a position facing silicon carbide raw material 7. Seed substrate 3 is held by a seed substrate holder 4. Seed substrate 3 is made of silicon carbide single crystal. A growth face 6 of seed substrate 3 is the plane, for example. Growth face 6 may be a plane inclined by an off angle within approximately 8°, for example, relative to the plane. Since the present embodiment corresponds to a method for manufacturing silicon carbide single crystal having a diameter larger than 100 mm, the diameter of seed substrate 3 is also larger than 100 mm.

Figure 2:
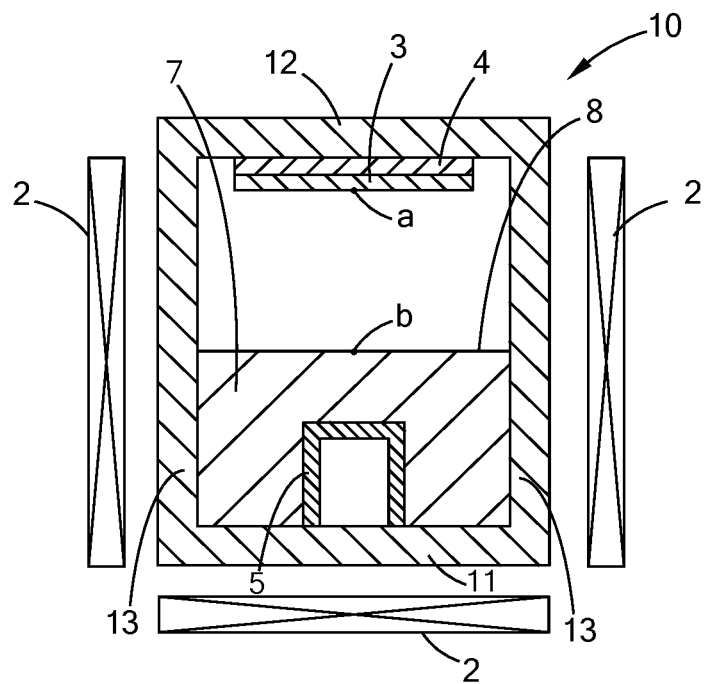
FIG. 2 is a more detailed schematic cross sectional diagram of the vapor deposition apparatus of FIG. 1 utilizing ultra pure SiC or SiOC materials in accordance with the present inventions.

Preferably in the step of growing silicon carbide single crystal, the maximum height of the silicon carbide single crystal growing on the seed substrate exceeds 20 mm. More preferably, the maximum height of the silicon carbide single crystal growing on the seed substrate exceeds 50 mm. Referring to FIG. 2, a further embodiment of the embodiment of FIG. 1 of a manufacturing device for silicon carbide single crystal according to the present embodiment will be described.

A manufacturing device 10 for silicon carbide single crystal according to the present embodiment is directed to growing silicon carbide single crystal having a diameter larger than 100 mm by sublimation. Manufacturing device 10 mainly includes a crucible 20, a heater 2, and a hollow member 5.

Crucible 20 is made of carbon. Silicon carbide raw material 7 is placed in crucible 20. Seed substrate 3 is arranged at a position facing surface 8 of silicon carbide raw material 7. Seed substrate 3 is held by a seed substrate holder 4. Seed substrate holder 4 is held by a lid section 12 of crucible 20.

Around a sidewall 13 of crucible 20 is provided a heater 2 to heat silicon carbide raw material 7 placed in crucible 20.

Heater 2 is arranged so as to also cover a bottom 11 of crucible 20. Preferably, heater 2 is arranged to cover the entire bottom 11 of crucible 20. Heater 2 may be an induction heating type heater, or a resistance heating type heater.

Hollow member 5 is empty inside. Hollow member 5 is provided to extend towards seed substrate 3 from bottom 11 of crucible 20 at the upper end face around the central region. Hollow member 5 is enclosed by silicon carbide raw material 7. Preferably, hollow member 5 is embedded in silicon carbide raw material 7. The height of hollow member 5 is lower than the height of silicon carbide raw material 7. Furthermore, heater 2 is located below hollow member 5. Since hollow member 5 is empty, the surface of silicon carbide raw material 7 around the central region can be heated efficiently by radiation. Thus, the temperature distribution of silicon carbide raw material 7 can be reduced. Alternatively, crucible 20 may have a bottom shaped protruding towards seed substrate 3 around the central region, instead of providing hollow member 5.

The thickness of bottom 11 of crucible 20 is preferably greater than 10 mm. More preferably, the thickness of bottom 11 of crucible 20 is greater than or equal to 20 mm. Accordingly, bottom 11 of crucible 20 can be heated efficiently by thermal conduction through carbon having thermal conductivity higher than that of silicon carbide. Then, the silicon carbide single crystal growing step is carried out. Specifically, by heating silicon carbide raw material 7 placed in crucible 20, silicon carbide raw material 7 is sublimated. The sublimated raw material gas recrystallizes on growth face 6 of seed substrate 3, whereby silicon carbide single crystal is grown on growth face 6.

If the size of silicon carbide single crystal to be grown becomes larger, the inner diameter of crucible 20 used must also be increased. If the inner diameter of crucible 20 is made larger, the distance from heater 2 arranged at the outer side of crucible 20 to the center "b" at surface 8 of silicon carbide raw material 7 (in other words, to the region of surface 8 of silicon carbide raw material 7 facing the center "a" of seed substrate 3) becomes longer. Therefore, the temperature distribution of silicon carbide raw material 7 will become greater since the region around the center "b" at surface 8 of silicon carbide raw material 7 is not readily heated.

If the temperature around the center "b" at surface 8 of silicon carbide raw material 7 becomes relatively low, the sublimated silicon carbide gas will be recrystallized on surface 8 of silicon carbide raw material 7. Therefore, silicon carbide crystal will also grow on surface 8 of silicon carbide raw material 7. If silicon carbide crystal grows on surface 8 of silicon carbide raw material 7, the space where silicon carbide single crystal can grow on growth face 6 of seed substrate 3 will become smaller, leading to difficulty in growing a thick silicon carbide single crystal film.

According to the method for manufacturing silicon carbide single crystal of the present embodiment, the maximum growing rate of silicon carbide single crystal growing on growth face 6 of seed substrate 3 is greater than the maximum growing rate of silicon carbide crystal growing on surface 8 of silicon carbide raw material 7. Therefore, when silicon carbide single crystal having a diameter larger than 100 mm is grown, a thick silicon carbide single crystal film can be obtained. Furthermore, the growing rate of silicon carbide single crystal growing on seed substrate 3 can be improved. Moreover, since growth of silicon carbide crystal on surface 8 of silicon carbide raw material 7 can be suppressed, the change in the growing environment of silicon carbide single crystal on seed substrate 3 can be reduced. Accordingly, occurrence of crystal defect at the silicon carbide single crystal can be reduced.

According to the method for manufacturing silicon carbide single crystal of the present embodiment, sublimation of silicon carbide raw material in the step of growing silicon carbide single crystal is carried out by heating surface 8 of silicon carbide raw material 7 at a region facing the center of seed substrate 3 through radiation. Accordingly, the temperature distribution of silicon carbide raw material 7 can be reduced. As a result, a thick silicon carbide single crystal film can be grown on seed substrate 3 by suppressing the growth of silicon carbide crystal on silicon carbide raw material 7.

The method for manufacturing silicon carbide single crystal of the present embodiment is carried out by heating the silicon carbide raw material through hollow member 5. Accordingly, surface 8 of silicon carbide raw material 7 around the central region can be heated more efficiently by radiation, allowing the temperature distribution of silicon carbide raw material 7 to be reduced. As a result, a thick silicon carbide single crystal film can be grown on seed substrate 3 by suppressing growth of silicon carbide crystal on silicon carbide raw material 7.

Example 26

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 8,216,369, the entire disclosure of which is incorporated herein by reference.

Unique electronic properties of silicon carbide (SiC) make it a very desirable material for state-of-the-art semiconductor devices that can operate at high frequencies, high voltages and current densities, and in harsh conditions. In many such devices, silicon carbide is utilized as a substrate on which the semiconductor device structure is formed using epitaxy, photolithography and metallization. Depending on the device design, the substrate must possess specified electronic parameters, such as conductivity type and resistivity. While devices operating at high and microwave frequencies (RF devices) require semi-insulating (SI) substrates with very high resistivity, for other devices, such as high power switching devices, low-resistivity n-type and p-type substrates are needed.

Figure 3:
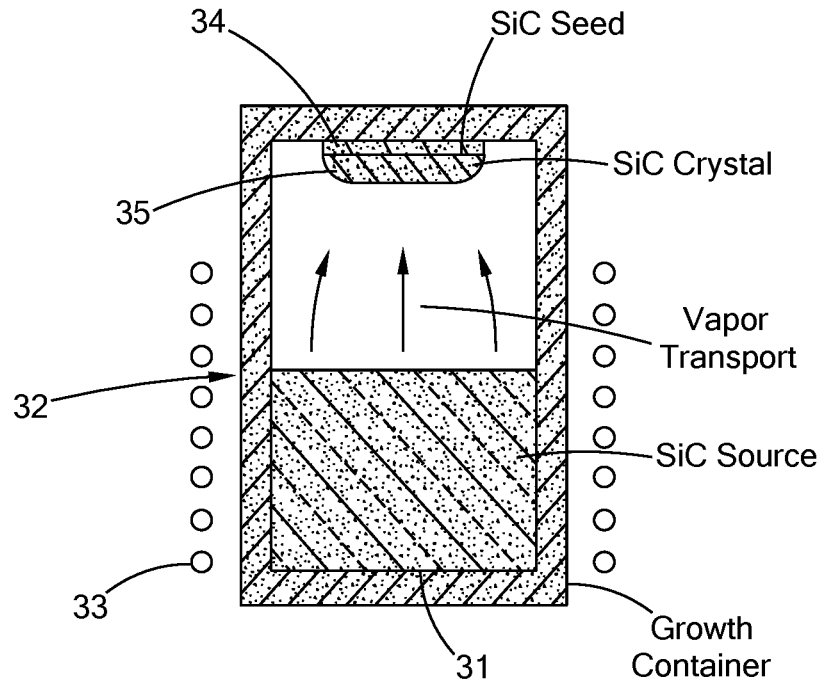
FIG. 3 is a schematic cross sectional diagram of a vapor deposition apparatus utilizing ultra pure SiC or SiOC materials in accordance with the present inventions.

Presently, SiC single crystals are grown on the industrial scale by a sublimation technique called Physical Vapor Transport (PVT). A schematic diagram of a typical prior art PVT arrangement is shown in FIG. 3. In PVT, polycrystalline grains of silicon carbide (SiC source) 31 are loaded on the bottom of a growth container 32 and a SIC seed crystal 34 is attached to a top of growth container 32. Desirably, growth container 32 is made of a material, such as graphite, that is not reactive with SiC or any dopant (discussed hereinafter) added thereto. The loaded growth container 32 is evacuated, filled with inert gas to a certain, desired pressure and heated via at least one heating element 33 (e.g., an RF coil) to a growth temperature, e.g., between 1900° C. and 2400° C. Growth container 32 is heated in such a fashion that a vertical temperature gradient is created making the SiC source 31 temperature higher than that of the SiC seed 34. At high temperatures, silicon carbide of the SiC source 31 sublimes releasing a spectrum of volatile molecular species to the vapor phase. The most abundant of these gaseous species are Si, $Si_2C$ and $SiC_2$. Driven by the temperature gradient, they are transported to the SIC seed 34 and condense on it causing growth of a SiC single crystal 35 on the SiC seed 34. Prior art patents in this area include, for example, U.S. Pat. Nos. 6,805,745; 5,683,507; 5,611,955; 5,667,587; 5,746,827; and Re. 34,861, which are all incorporated herein by reference.

Those skilled in the art of semiconductor materials know that production of SIC substrates with desirable electronic properties is impossible without purposeful introduction of certain impurities in a process known as doping. In silicon carbide, the chemical bonds are so exceptionally strong and solid-state diffusion of impurities is so slow that doping in the bulk can be accomplished only at the stage of crystal growth, when the doping element (dopant) incorporates directly into the lattice of the growing SiC crystal 35.

As a particular example of SIC doping during growth, n-type SIC crystals are produced by adding small amounts of gaseous nitrogen ($N_2$) to growth container 32 atmosphere. Nitrogen-doped SiC single crystals with very uniform electrical properties can be readily grown by maintaining appropriate partial pressure of $N_2$ during growth.

With the exception of the nitrogen-doped crystals, attaining uniform electrical properties in other types of SIC crystals, including semi-insulating, p-type and phosphorus doped n-type crystals, is much more difficult because the doping compounds are not gaseous but solid. Vanadium is one particularly important dopant, which is used to produce a high-resistivity semi-insulating SiC crystal. Aluminum is another important dopant used for the growth of conductive crystals of p-type. Other solid dopants include boron, phosphorus, heavy metals and rare earth elements.

Prior art doping of SiC crystals using a solid dopant is carried out by admixing small amounts of impurity directly to the SiC source 31. For instance, vanadium can be introduced in the form of elemental vanadium, vanadium carbide or vanadium silicide. Aluminum can be introduced in the elemental form, aluminum carbide or aluminum silicide. Other suitable solid dopants, such as boron or phosphorus, can be similarly introduced as elements, carbides or silicides. The doping compound can be in the physical form of powder, pieces or chips.

During SIC crystal 35 sublimation growth, multi-step chemical reactions take place between the SiC source 31 and the dopant admixed directly in the SiC source. These reactions proceed through several stages and lead to the formation of multiple intermediary compounds. In the case of vanadium doping, thermodynamic analysis shows that the product of reaction between SiC and vanadium dopant (whether elemental, carbide or silicide) depends on the stoichiometry of SiC. That is, when the SIC source 31 is Si-rich and its composition corresponds to the two-phase equilibrium between SIC and Si, formation of vanadium silicide ($VSi_2$) is likely. When the SiC source is C-rich and its composition corresponds to the two-phase equilibrium between SiC and C, formation of vanadium carbide ($VC_x$) is likely.

It is known that freshly synthesized SiC source 31 is, typically, Si-rich. Due to the incongruent character of SiC sublimation, the initially silicon-rich SiC source 31 gradually becomes carbon-rich. This change in the stoichiometry of the SIC source 1 during sublimation growth causes the following sequence of reactions:

During initial stages of growth, when the SiC source 31 is Si-rich, reaction between vanadium dopant and SIC yields vanadium silicide $VSi_2$.

As the growth progresses and the SiC source 31 becomes more carbon-rich, vanadium silicide converts to intermediate carbo-silicide $VC_xSi_y$.

During final stages of growth, when the SiC source 31 is carbon-rich, vanadium carbo-silicide converts into vanadium carbide $VC_x$.

A physical vapor transport system includes a growth chamber charged with source material and a seed crystal in spaced relation, and at least one capsule having at least one capillary extending between an interior thereof and an exterior thereof, wherein the interior of the capsule is charged with a dopant. Each capsule is installed in the growth chamber. Through a growth reaction carried out in the growth chamber following installation of each capsule therein, a crystal is formed on the seed crystal using the source material, wherein the formed crystal is doped with the dopant.

Figure 4:
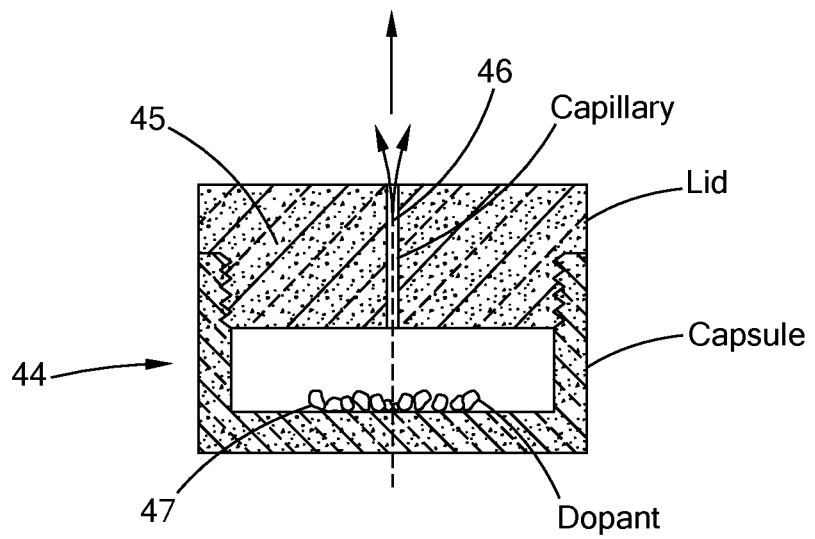
FIG. 4 is a schematic cross sectional diagram of a vapor deposition apparatus utilizing ultra pure SiC or SiOC materials in accordance with the present inventions.

With reference to FIG. 4, the advantages of spatially uniform and controlled doping are realized using a time-release capsule 44, which is loaded with a stable form of solid dopant, and placed inside growth container 32 (of FIG. 3). Capsule 44 is desirably made of an inert material, which is reactive with neither SiC nor the dopant. For a majority of applications, dense and low-porosity graphite is a preferred material for capsule 44. Other possible materials include refractory metals, their carbides and nitrides. However, this is not to be construed as limiting the embodiment.

Capsule 44 includes a tight lid 45 having one or more calibrated through-holes or capillaries 46 of predetermined diameter and length. There are no limitations on the dimensions of capsule 44 except that it should fit inside growth container 32 and not restrict the flow of vapor to the SiC seed 34.

At a suitable time, capsule 44 is loaded with the proper amount of solid dopant 47. Dopant 47 must be either in a stable chemical form that is not reactive with the material of capsule 44 or in a form that upon reaction with the material forming capsule 44 produces a stable compound. For the majority of practical applications, the preferred forms of solid dopant are: (i) elemental form, (ii) carbide and (iii) silicide. However, this is not to be construed as limiting the embodiment.

During sublimation growth of the SiC crystal 35, capsule 44 is situated inside growth container 32.

Figure 5:
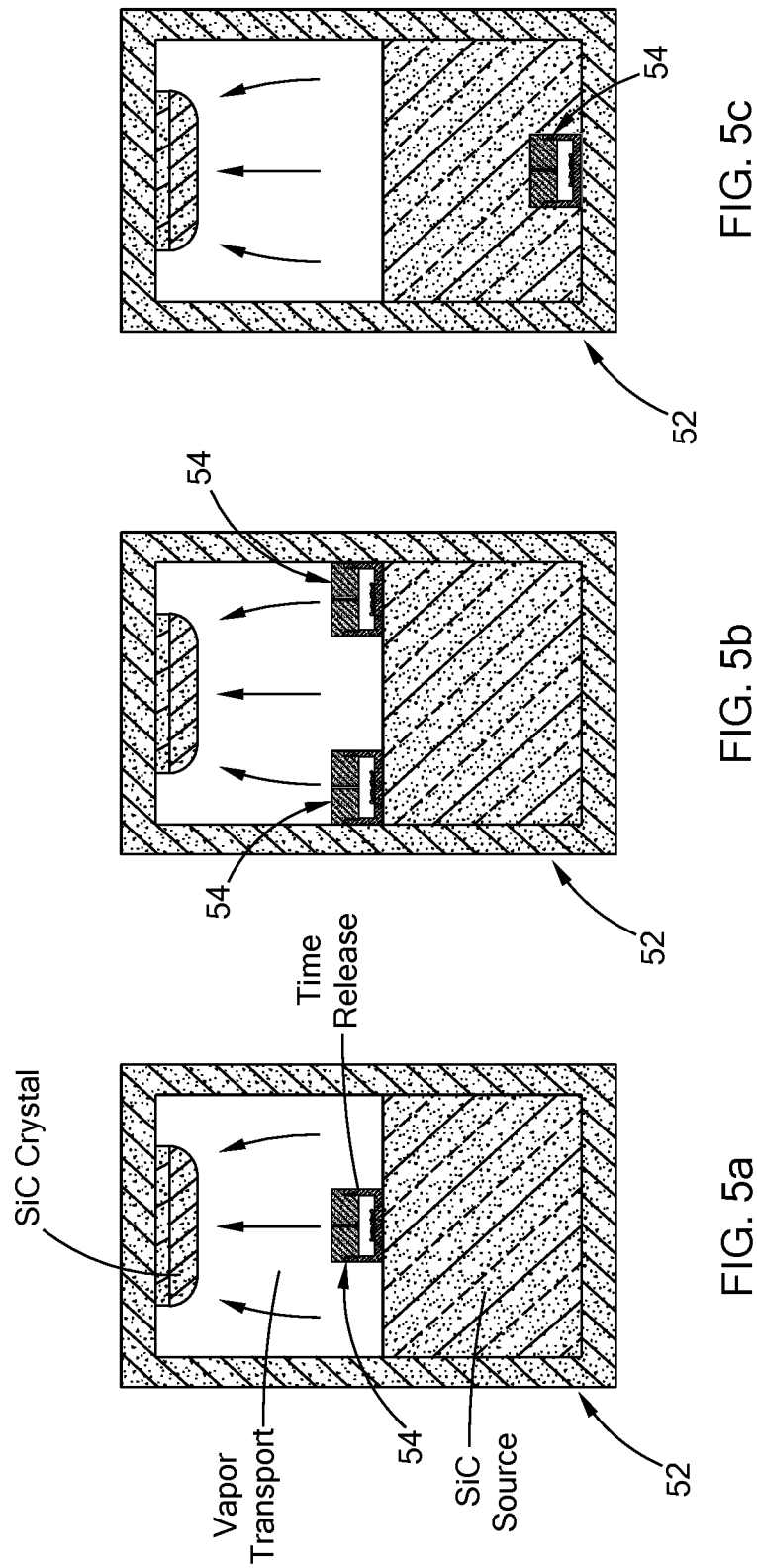
FIGS. 5a, 5b, 5c, are schematic cross sectional diagrams of a vapor deposition apparatus utilizing ultra pure SiC or SiOC materials in accordance with the present inventions.

In one embodiment, shown in FIG. 5a, a single capsule 54 is positioned on the top surface of the SIC source near the axis of growth container 52. In another embodiment, shown in FIG. 5b, several capsules 54 are positioned on the top surface of the SIC source near the wall of growth container 52. In yet another embodiment, shown in FIG. 5c, capsule 54 is buried within the material forming the SiC source.

The principle of operation of capsule 54 is based on the well-known phenomenon of effusion, i.e., the slow escape of vapor from a sealed vessel through a small orifice. At high temperatures, the vapor pressure of dopant inside capsule forces it to escape through each capillary. If the cross section of each capillary is sufficiently small, the vapor pressure of dopant in capsule does not differ substantially from the equilibrium value.

The laws of effusion are well-known and, for given growth conditions (temperature, vapor pressure of the inert gas, volatility of the substance contained in capsule 54, capillary diameter and capillary length), the flux of the molecules of dopant escaping capsule 54 via each capillary can be readily calculated. Thus, the dimension of each capillary and number of capillaries can be tailored to achieve a steady and well-controlled flux of the impurity dopant atoms from capsule 54 to the growing SIC crystal.

For relatively small doping levels, a capsule 54 having a single capillary can be used (see embodiment in FIG. 5*a*). For higher doping levels or doping with multiple dopants, multiple capsules 54 can be used (see embodiment in FIG. 5*b*), as well as a capsule 54 with multiple capillaries. For special purposes, such as programmable or delayed doping, one or more time-release capsules 54 buried in the depth of the SiC source can be utilized (see embodiment in FIG. 5*c*).

According to prior art SiC doping, a small amount of dopant is admixed directly to the SiC source material, leading to chemical reactions between the dopant and SiC source. These reactions, combined with changes in the stoichiometry of the SiC source material, lead to progressive changes in the partial pressure of the dopant. As a result, prior art doping produces initially high concentrations of dopant in the crystal followed by a decrease in the dopant concentration over the SiC crystal length. Crystals grown according to the prior art have too high a degree of dopant in the first-to-grow sections and insufficient dopant in the last-to-grow sections. The dopant level in the first-to-grow boule sections can be so high that second-phase precipitates form in the crystal bulk leading to the generation of crystal defects.

The present embodiment eliminates the problems of the prior art by using one or more time-release capsules for the doping of SiC crystals during crystal growth. The embodiment has two distinct advantages:

First, the present embodiment eliminates direct contact between the dopant and the SiC source. This is accomplished by placing the dopant inside of a capsule made of an inert material.

Second, the present embodiment offers a means for precise control of the dopant concentration. This is achieved by choosing the number of capsules, the number and dimensions of the capillaries, and the position of each capsule within growth container.

The present embodiment offers the following technical advantages over the prior art. First, it eliminates direct contact between the dopant and the SiC source, so the transient processes associated with the chemical reactions between the dopant and SiC source are avoided or eliminated. Secondly, the present embodiment provides a means to precisely control the flux of the dopant to the SiC seed. These technical advantages lead to the production of precisely and uniformly doped SiC crystals.

The direct consequence of precise and spatially uniform doping is SiC single crystals with spatially uniform and controllable electrical properties. In addition to the superior electrical properties, the embodiment avoids or eliminates the formation of impurity precipitates and associated defects and, thus, leads to the improvement in the SiC crystal quality and wafer yield.

Specifically, for a vanadium doped SiC crystal, the application of the present embodiment increases the yield of usable prime quality SiC wafers by as much as 50%. This in-turn leads to reduced costs and improved profitability.

The present embodiment can be applied to the growth of semi-insulating 6H-SiC single crystals doped during growth with vanadium. However, this is not to be construed as limiting the embodiment since it is envisioned that the embodiment can also be applied to the growth of 4-SiC, 3C-SiC or 15R-SiC single crystals doped during growth with a suitable dopant. In Examples 2 and 3 below, a single time-release capsule made of pure dense graphite is used. All other parameters of the SiC growth process, such as temperature, pressure, temperature gradient, etc., are in accordance with existing growth techniques used for the production of SiC crystals.

Example 27

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 8,512,471 the entire disclosure of which is incorporated herein by reference. The ultra pure SiC materials greatly improve the process and apparatus of the U.S. Pat. No. 8,512,471 patent, by enhancing or potentially eliminating, e.g., making unnecessary, the need for that patent's methods and apparatus to remove Boron and other impurities.

In a physical vapor transport growth technique for silicon carbide a silicon carbide powder and a silicon carbide seed crystal are introduced into a physical vapor transport growth system and halosilane gas is introduced separately into the system. The source powder, the halosilane gas, and the seed crystal are heated in a manner that encourages physical vapor transport growth of silicon carbide on the seed crystal, as well as chemical transformations in the gas phase leading to reactions between halogen and chemical elements present in the growth system.

Figure 6:
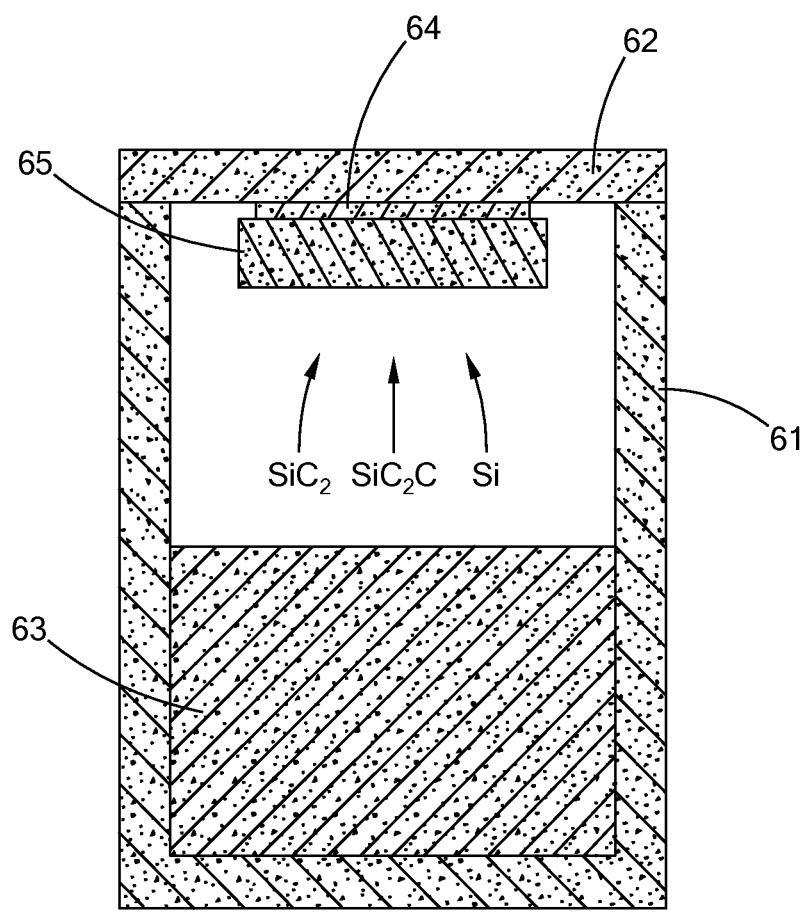
FIG. 6 is a schematic cross sectional diagram of a vapor deposition apparatus utilizing ultra pure SiC or SiOC materials in accordance with the present inventions.

Physical Vapor Transport (PVT) is the most common sublimation technique used for SiC crystal growth. A schematic diagram of the conventional PVT arrangement is shown in FIG. 6. Generally, growth is carried out in a graphite crucible 61 sealed with a graphite lid 62 and loaded with a sublimation source 63 and a seed 64. Generally, a polycrystalline SiC source 63 is disposed at the bottom of the crucible 61 and a SiC seed 64 at the top of crucible 61. The seed 64 is often mounted directly to the crucible lid 62 using adhesives or other suitable means. Crucible 61 is heated to a growth temperature, generally between 2000° C. and 2400° C., where source 63 vaporizes and fills crucible 61 with volatile molecular species of $Si_2C$, $SiC_2$ and Si. During growth, the temperature of source 63 is maintained higher than the temperature of the seed 46. This temperature difference forces the vapors from source 63 to migrate and precipitate on seed 64 forming a single crystal 65. In order to control the growth rate and ensure high crystal quality, PVT growth is carried out under a small pressure of inert gas, generally between several and 200 Torr.

It is known that the permeability of graphite depends on the nature of the gas diffusing through graphite. Graphite is generally permeable to inert gases, hydrogen and nitrogen, but has a much lower permeability to the elements that form stable carbides. Accordingly, graphite has a very low permeability to the vapors formed during sublimation of silicon carbide, such as Si, $Si_2C$ and $SiC_2$. Therefore, conventional PVT can be viewed as a "closed" process, in which the Si-bearing vapors practically do not leave the growth crucible, except small unintentional losses that can occur through the joint between the crucible body 61 and lid 62.

Figure 7:
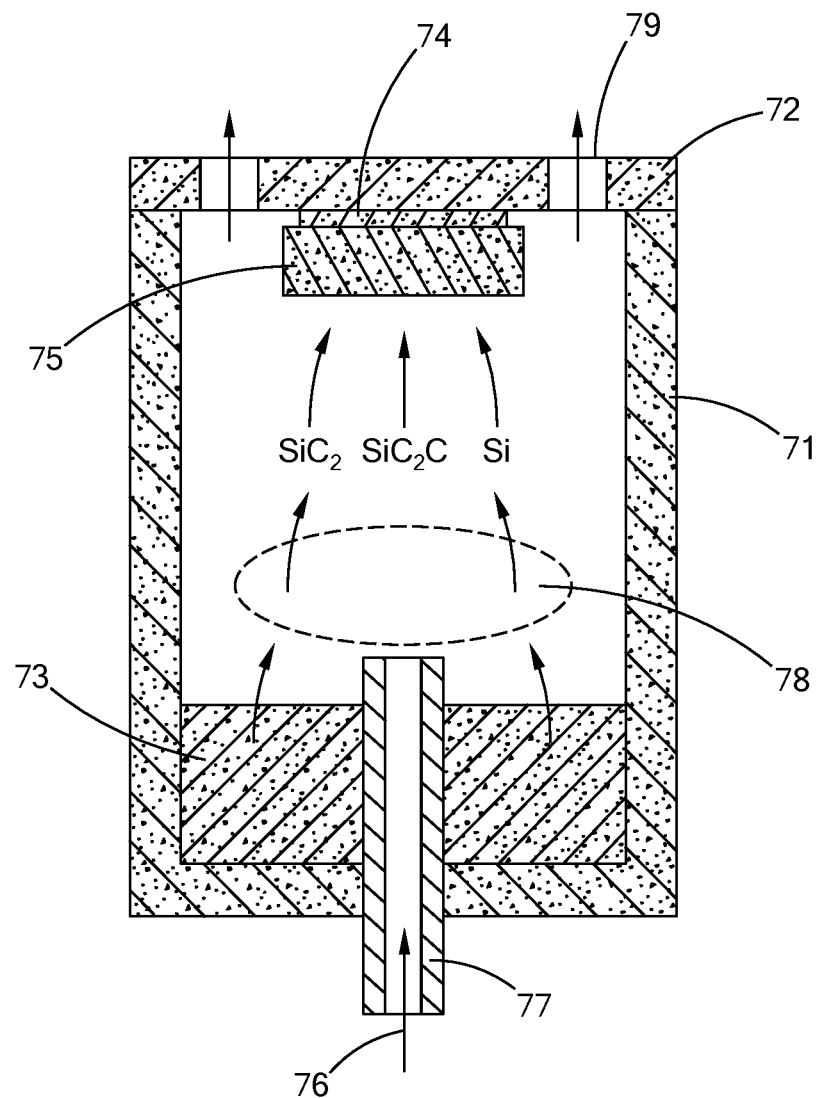
FIG. 7 is a schematic cross sectional diagram of a vapor deposition apparatus utilizing ultra pure SiC or SiOC materials in accordance with the present inventions.

SiC single crystals have also been grown using "open" processes, where a deliberate gas flow is established between the crucible interior and exterior. Examples include High Temperature Chemical Vapor Deposition (HTCVD), Halide Chemical Vapor Deposition (HCVD) and some PVT modifications. A generalized diagram of the open SiC growth process is shown in FIG. 7. Similarly to the closed sublimation growth process, the open process is carried out in a graphite crucible 71, wherein source 73 is disposed at the crucible bottom and seed 74 is disposed at the crucible top. Graphite crucible 71 used in the open process is provided with a gas inlet 7 and gas outlet(s) 79. A gas mixture 76, that may contain Si precursors, C precursors, dopants and other gaseous components, enters the crucible through an inlet 77. Once inside the crucible 71, the reactants undergo chemical transformations in a reaction zone 78. The gaseous reaction products blend with the vapors originating from solid source 73 and move toward seed 4, where they precipitate on seed 74 and form single crystal 75. Gaseous byproducts escape through gas outlet(s) 79. In the process of Halide Chemical Vapor Deposition (HCVD), the silicon and carbon precursors are delivered to the reaction zone 78 in the form of silicon tetrachloride ($SiCl_4$) and propane ($C_3H_8$) mixed with a large excess of hydrogen. The main drawback of the open SiC sublimation growth process is related to severe losses of Si-bearing vapors through the outlet port(s) 79.

Graphite is widely utilized in SiC sublimation growth as a material for crucibles, seed-holders, heat shields and other parts. The starting materials used in graphite manufacturing (coke and pitch) contain boron. Therefore, boron is always present in graphite, where its atoms are chemically bound to carbon. High-temperature treatment under a halogen-containing atmosphere is widely used by graphite manufacturers for purification. During purification, the halogen molecules penetrate the graphite bulk, react with various impurities and form volatile halides with them. Driven by the concentration gradient, the halide molecules diffuse from the graphite bulk toward the surface, where they are removed by the flow of the carrier gas. Typically, removal of metallic impurities from graphite is more efficient than removal of boron.

Conventionally, graphite manufacturers characterize graphite purity by the "ash content", i.e., the amount of ash that remains after a graphite specimen is burnt in oxygen. The best-purity commercially available graphite contains between 5 and 20 ppm of ash by weight. Boron forms volatile oxide upon burning in oxygen; therefore, graphite manufacturers seldom specify boron content in graphite. Impurity analyses using Glow Discharge Mass Spectroscopy (GDMS) show that the boron content even in the lowest-ash graphite is, typically, above 0.2 ppm and, in some cases, up to 1 ppm.

Furnaces used for graphite purification are, typically, very large and capable of accommodating metric tons of graphite. Cross-contamination between different items in a large graphite batch and contamination from the furnace itself limit the purification efficiency. As a result of the above limitations, graphite with a boron content below 0.1 ppm by weight is not readily available on a regular commercial basis.

Optimization of conventional PVT sublimation growth, including protective coatings applied to interior surfaces of a graphite crucible, has led to the reduction of boron in the grown SiC crystals to $(2-3) \cdot 10^{16}$ $cm^{-3}$. However, in order to produce semi-insulating SiC crystals of better quality and with superior electrical parameters, the concentration of unintentional boron must be reduced to levels below $10^{16}$ $cm^{-3}$.

The strong reduction of unintentional boron in SiC crystals can be achieved if the growth process is combined with simultaneous removal of boron from the growth crucible. It is believed that heretofore in-situ purification of SiC crystals during growth was not known in the art.

SiC sublimation growth utilizes crucibles, seed-holders, heat shields and other parts made of graphite. Generally, graphite contains detectable levels of boron impurity, which can contaminate the growing crystal. To overcome this problem, SiC sublimation growth is carried out in the presence of dynamic reactive atmosphere comprised of an inert carrier gas and at least one reactive gas. The flow of reactive gas is supplied into the graphite growth crucible through an inlet port, and it escapes the crucible by filtering out across the permeable crucible wall.

The main reactive component of the gas mixture is a halosilane gas, desirably tetrahalosilane, such as tetrachlorosilane ($SiCl_4$) or tetrafluorosilane ($SiF_4$). The halosilane additive is added in concentrations between 0.1 and 10% by volume and, more desirably, between 1 and 5%. At high temperatures of SiC sublimation growth, the halosilane undergoes pyrolysis forming lower halosilanes, such as $SiCl_3$ and $SiCl_2$. The products of pyrolysis react with boron forming volatile boron halides, such as $BCl$, $BCl_2$ and $BCl_3$. The boron-containing byproducts are removed from the interior of the growth crucible by the flow of the gas mixture, which passes across (thorough) the permeable crucible wall.

Lower halosilanes can attack the SiC source and growing crystal, leading to losses of silicon from the growth charge. In order to reduce these losses, the gas mixture can include small amounts of hydrogen, desirably between 0.1 to 3% by volume. The presence of hydrogen shifts the thermodynamic equilibrium in the gas phase in such a fashion that chemical attack on the SiC source and crystal is reduced.

The grown crystals are characterized by the concentration of unintentional boron acceptor below $7 \cdot 10^{15}$ $cm^{-3}$ and resistivity above $10^7$ Ohm·cm.

Disclosed herein is a crystal growth method that includes (a) providing an enclosed growth crucible inside of a growth chamber with a thermal insulation disposed therebetween, the growth crucible having polycrystalline source material and a seed crystal disposed in spaced relation therein; (b) heating the interior of the growth crucible such that a temperature gradient forms between the source material and the seed crystal, the source material is heated to a sublimation temperature and the temperature gradient is sufficient to cause sublimated source material to be transported to the seed crystal where the sublimated source material precipitates on the seed crystal; and (c) causing a gas mixture to flow into the growth crucible and between the polycrystalline source material and an interior surface of the growth crucible, whereupon the gas mixture reacts with an unwanted element in the body of the growth crucible to form a gaseous byproduct which flows through the growth crucible to the exterior of the growth crucible, which is formed of a material that is permeable to the gas mixture and the gaseous byproduct, under the influence of the flow of the gas mixture into the growth crucible, wherein the unwanted element is boron and the gas mixture comprises the combination of (a) halosilane gas and (b) an inert gas.

The inert gas can be either argon or helium.

The halosilane gas can be tetrahalosilane in a concentration in the gas mixture between either 0.1% and 10% by volume, or between 1% and 5% by volume.

The gas mixture can further include hydrogen. The concentration of hydrogen in the gas mixture can be between 0.1% and 3% by volume.

The polycrystalline source material can be disposed in a source crucible which is disposed inside the growth crucible in spaced relation to interior surfaces of the growth crucible. An exterior of a base of the source crucible can be disposed in spaced relation to an interior of a floor of the growth crucible, thereby defining a first gap therebetween. An exterior of a wall of the source crucible can be disposed in spaced relation to an interior of a wall of the growth crucible, thereby defining a second gap therebetween. The gas mixture can flow in the first and second gaps.

The flow of the gas mixture can be between 20 and 200 sccm.

The wall(s) of the growth crucible can have a thickness that is between either 4 mm and 20 mm, or between 8 mm and 16 mm.

The growth crucible can be made from graphite. The growth chamber can be made from fused silica. The thermal insulation can be made from a porous graphite.

Also disclosed herein is a crystal growth method that comprises (a) providing a seed crystal and a source material in spaced relation inside of a growth crucible is made from a material that is at least in-part gas permeable and which includes an element in the body thereof that is not wanted in a crystal grown in the growth crucible; (b) heating the growth chamber whereupon the source material sublimates and is transported via a temperature gradient in the growth chamber to the seed crystal where the sublimated source material precipitates; and (c) concurrent with step (b), causing a gas mixture to flow inside the growth crucible in a manner whereupon the unwanted element reacts with the gas mixture and is transported to the exterior of the growth crucible via the at-least gas permeable part thereof.

The gas mixture can flow through the growth crucible at a rate between 20 standard cubic centimeters per minute (seem) and 200 sccm.

The source material can be disposed in a source crucible that is positioned inside the growth crucible. The exterior wall of the source crucible can be spaced from an interior wall of the growth crucible. The space can be between 4 mm and 7 mm.

The unwanted element can be boron. The gas mixture can be a combination of (a) halosilane gas and (b) an inert gas.

The growth crucible can be comprised of graphite. The source material and the seed crystal can comprise SiC.

Figure 8:
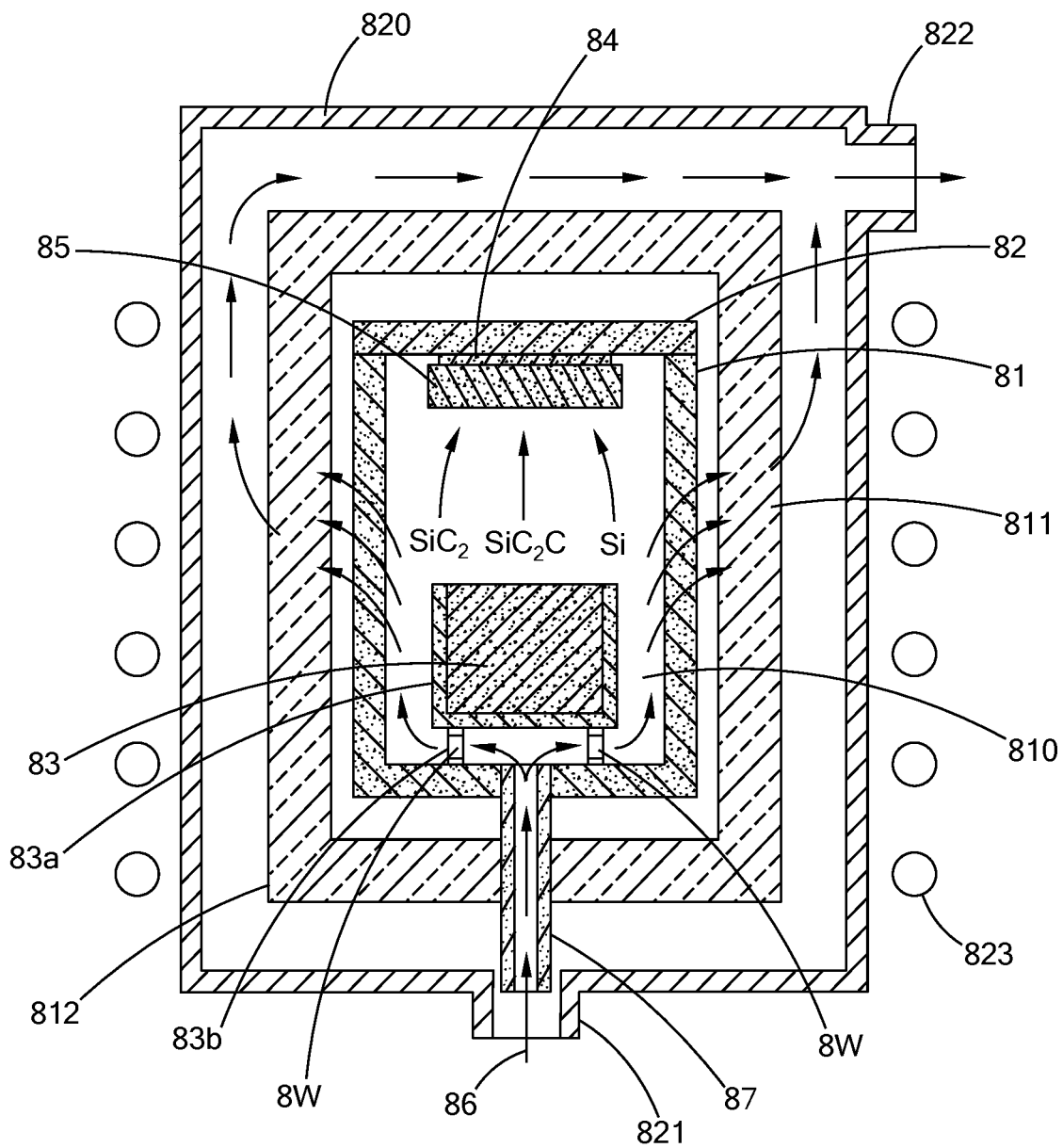
FIG. 8 is a schematic cross sectional diagram of a vapor deposition apparatus utilizing ultra pure SiC or SiOC materials in accordance with the present inventions.

With reference to FIG. 8, more specifically, PVT sublimation growth of silicon carbide is carried out in a graphite growth crucible 1 sealed with a graphite lid 2. Desirably, crucible 81 and lid 82 are made of high-density, fine-grain and low-porosity graphite, such as "ATJ" available from Union Carbide Corporation of Danbury, Conn., under registered trademark UCAR® (registration number 1008278), or similar. Growth crucible 81 is loaded with a SiC polycrystalline source 3 and a noncrystalline seed crystal 84. Source 83 is disposed in a lower portion of the crucible 81 while seed 84 is disposed at the top of the crucible, desirably attached to crucible lid 82, as shown in FIG. 8. Source 3 is contained in a thin-walled graphite source crucible 83a, which rests on a graphite pedestal 83b. The dimensions of growth crucible 81, source crucible 83a and pedestal 83b are such that a gap 810 exists between the wall of the source crucible 83a and the wall of the growth crucible 81. Desirably, this gap is between 4 and 7 mm wide.

Growth crucible 1, loaded with source 83 and seed crystal 84, is placed inside a chamber 820 of the growth station, where it is surrounded by a thermal insulation 812. Thermal insulation 812 is made of lightweight fibrous graphite, such as graphite felt or foam. The growth station includes a means for heating crucible 81 to a growth temperature. In one particular embodiment, the chamber 820 is water-cooled and is made of fused silica, and the heating means is realized by an exterior RF coil 823. Metal chambers with resistive heaters or RF coils located inside the chamber can also or alternatively be utilized.

In order to initiate sublimation growth, crucible 81 is heated to the growth temperature, desirably between 2000° C. and 2400° C. At the growth temperature, SiC source 83 sublimes and fills the interior of the crucible 81 with vapor including Si, $Si_2C$ and $SiC_2$ volatile molecules. During growth, the temperature of source 83 is kept higher than the temperature of seed crystal 84. This results in vapor transport in the direction from source 83 to seed crystal 84. After reaching seed crystal 84, the vapors condense thereon causing growth of a SiC single crystal 85 on seed crystal 84.

During growth of single crystal 85, a gas mixture 86 is supplied into growth crucible 81 by passing first through an inlet 821 of chamber 820 and then through an inlet port 87 of crucible 81. After entering growth crucible 81, gas mixture 86 flows through windows W in pedestal 83b and in the gap 810 formed between walls of growth crucible 1 and the source crucible 83a, as shown in FIG. 8.

Gas mixture 86 supplied into growth crucible 81 is comprised of an inert carrier gas, desirably argon or helium, and one or more reactive gaseous additives. The main reactive additive is a halosilane gas, desirably tetrahalosilane ($SiCl_4$ or $SiF_4$). The concentration of halosilane in the gas mixture is desirably between 0.1 and 10% by volume, and more desirably between 1 and 5%. The gas mixture may contain another reactive gaseous additive, such as hydrogen. The concentration of hydrogen is desirably between 0.1 and 3% by volume.

Inside growth crucible 81, the halosilane gas reacts with boron and converts it into volatile boron halides. These gaseous boron byproducts are removed from the interior of the crucible 81 by filtering through the permeable wall of the crucible 81. Thereafter, these byproducts are removed from growth chamber 820 through an outlet port 822 by the flow of gas mixture 86 into growth chamber 820.

The chemical form of boron in the conditions of SiC sublimation growth is not exactly known. It is assumed that at high temperatures and in the presence of carbon and SiC, boron can be either in the form of elemental boron vapor, or in the form of a chemical compound with carbon, or in the form of a chemical compound with silicon. It is commonly believed that boron contained in graphite bulk is chemically bound to carbon and forms chemical bonds similar to those of boron carbide, $B_4C$.

At the high temperatures of SiC sublimation growth, the halosilane additive undergoes pyrolysis. Pyrolysis of tetrahalosilane produces lower halosilanes. For example, the main products of $SiCl_4$ pyrolysis are $SiCl_2$ and $SiCl_3$. Thermodynamic analysis shows that, independently of the chemical form of boron, whether elementally or chemically bound to carbon or silicon, the lower halosilanes would react with boron-containing molecules and produce volatile boron halides, such as $BCl$, $BCl_2$ and $BCl_3$.

Argon and helium, as well as gaseous boron halides, have sufficient permeability in graphite. Therefore, efficient removal of gaseous boron byproducts from growth crucible 81 can be realized by establishing their flow across the permeable wall of crucible 81. This can be achieved using the flow of carrier gas 86 across the crucible wall. In FIG. 8, arrows 811 symbolize the removal of boron halide products with the flow of carrier gas 6 passing across the crucible wall.

An additional benefit of the halosilane reactive additive is in its ability to react with boron contained in the bulk of graphite. While filtering across the crucible wall, carrier gas 86 delivers the products of halosilane pyrolysis into the graphite bulk, where they react with boron chemically bound to carbon. The flow of inert carrier gas 86 across the crucible wall facilitates the removal of volatile boron halides to the exterior of growth crucible 81.

At high temperatures, certain products of halosilane pyrolysis can attack SiC source 83 and growing crystal 85. For instance, higher halosilane $SiCl_3$ can attack SiC leading to the appearance of free carbon and lower halosilane $SiCl_2$. This process can lead to removal of silicon from growth crucible 81, depletion of the SiC source 83 by silicon, and erosion of the SiC crystal 85. In order to avoid this, the gas mixture supplied into crucible 81 contains a small amount of hydrogen. The presence of hydrogen in the gas phase leads to the appearance of small quantities of hydrogen halides (HCl in the case of $SiCl_4$ and HF in the case of $SiF_4$) and shifts the thermodynamic equilibrium in such a fashion that chemical attack on the SiC source 83 and crystal 85 is greatly reduced. In order to achieve this, the amount of hydrogen in the gas mixture is desirably between 0.1 to 3% by volume.

In order for boron removal to be effective, the flow of gas mixture 6 is desirably between 20 sccm and 200 sccm. Too high of a flow can create a harmful overpressure inside crucible 81 and/or disturb the growth process, while too low of a flow can be ineffective or lead to the escape of Si-bearing vapors through the inlet port 87 of crucible 81.

The crucible wall should be thin enough to allow efficient escape of the volatile boron halides by filtering/diffusion. At the same time, the crucible wall must not be too thin, otherwise, it may become transparent to the silicon-bearing vapors such as $SiC_2$, $Si_2C$ and Si and cause Si losses from the crystal growth source 83. Desirably, the thickness of the graphite crucible wall is desirably between 4 mm and 20 mm and, more desirably, between 8 mm and 16 mm.

In summary, removal of boron from the growth crucible is carried out in-situ during SiC crystal growth. To this end, a reactive gas mixture is supplied into the growth crucible through an inlet port, and it escapes the crucible by filtering out through the permeable crucible wall. The gas mixture is comprised of an inert carrier gas and a halosilane gas, desirably $SiCl_4$ or $SiF_4$, added in quantities between 0.1 and 10% by volume, and more desirably between 1 and 5%. Even more desirably, a small amount of hydrogen is added to the gas mixture in concentrations between 0.1 and 3% by volume. At high temperatures, the halosilane additive undergoes pyrolysis. The pyrolysis products react with boron, including boron residing in graphite. As a result of reaction, volatile boron halides are produced. Subsequently, they are removed from the growth crucible by filtering out across the permeable crucible wall, assisted by the flow of carrier gas. The hydrogen additive reduces the chemical attack of the SiC source and crystal and losses of silicon from the growth crucible. The grown crystal 85 has a concentration of unintentional boron acceptor below $7 \cdot 10^{15}$ cm$^{-3}$ and resistivity above $10^7$ Ohm·cm.

In summary, the foregoing description discloses, among other things:

A process for sublimation growth of SiC single crystals, in which growth is carried out under dynamic reactive atmosphere.

The use of a reactive atmosphere for SiC sublimation growth comprised of an inert carrier gas, desirably, pure argon or helium, mixed with reactive gas additives.

The use of a reactive gas additive comprising a halosilane, desirably $SiCl_4$ or $SiF_4$.

The use of a reactive atmosphere for SiC sublimation growth, which includes a combination of halosilane and hydrogen.

The use of a reactive atmosphere for SiC sublimation growth, in which the concentration of halosilane is desirably between 0.1 and 10% by volume, and more desirably between 1 and 5% by volume.

The use of a reactive atmosphere for SiC sublimation growth, in which the concentration of hydrogen is desirably between 0.1 and 3% by volume.

A process of PVT sublimation growth under a continuous flow of a reactive gas mixture, in which the reactive gas mixture enters the growth crucible through an inlet port and escapes the crucible by filtering across the permeable crucible wall.

A process of PVT sublimation growth under continuous flow of a reactive gas mixture, where the flow rate of the gas mixture is desirably between 10 sccm and 200 sccm, and more desirably between 20 sccm and 100 sccm.

A growth crucible made of dense, fine-grain and low-porosity graphite having the wall desirably between 4 mm and 20 mm thick, and more desirably between 8 mm and 16 mm thick.

A SiC sublimation growth process, in which the SiC source is contained in a thin-walled crucible disposed inside the growth crucible in such a fashion that a gap exists between the base and wall of the growth crucible and the base and wall of the source crucible. The gap between the walls of the growth crucible and the source crucible is desirably between 2 mm and 10 mm wide, and more desirably between 4 mm and 7 mm wide.

SiC single crystals of 4H, 6H, 15R and 3C polytypes having unintentional boron acceptor in concentrations below $7 \cdot 10^{15}$ cm$^{-3}$.

Technical advantages of the above-described method and apparatus include:

Reduced concentration of unintentional boron acceptors in 6H and 4H SiC crystals;

Higher and spatially more uniform resistivity in semi-insulating SiC crystals; and Higher yield of semi-insulating substrates per boule.

Example 28

6-nine pure, and preferably 7-nines pure (greater purity may also be used) polysilocarb derived SiC or SiOC that is disclosed and taught in patent application Ser. No. 14/864, 539 (US Publication No. 2016/0208412), Ser. No. 14/864, 125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 6,824,611 the entire disclosure of which is incorporated herein by reference.

A method and apparatus for controlled, extended and repeatable growth of high quality silicon carbide boules of a desired polytype is disclosed which utilizes graphite crucibles coated with a thin coating of a metal carbide and in particular carbides selected from the group consisting of tantalum carbide, hafnium carbide, niobium carbide, titanium carbide, zirconium carbide, tungsten carbide and vanadium carbide.

Silicon carbide is a perennial candidate for use as a semiconductor material. Silicon carbide has a wide bandgap, a low dielectric constant, and is stable at temperatures far higher than temperatures at which other semiconductor materials, such as silicon, become unstable. These and other characteristics give silicon carbide excellent semiconducting properties. Electronic devices made from silicon carbide can be expected to perform, inter alia, at higher temperatures, faster speeds and at higher radiation densities, than devices made from other commonly used semiconductor materials such as silicon.

Those familiar with solid-state physics and the behavior of semiconductors know that a semiconductor material must have certain characteristics to be useful as a material from which electrical devices may be manufactured. In many applications, a single crystal is required, with low levels of defects in the crystal lattice, along with low levels of unwanted chemical and physical impurities. If the impurities cannot be controlled, the material is generally unsatisfactory for use in electrical devices. Even in a pure material, a defective lattice structure can prevent the material from being useful.

Silicon carbide possesses other desirable physical characteristics in addition to its electrical properties. It is very hard, possessing a hardness of 8.5-9.25 Mohs depending on the polytype [i.e., atomic arrangement] and crystallographic direction. In comparison, diamond possesses a hardness of 10 Mohs. Silicon carbide is brilliant, possessing a refractive index of 2.5-2.71 depending on the polytype. In comparison, diamond's refractive index is approximately 2.4. Furthermore, silicon carbide is a tough and extremely stable material that can be heated to more than 2000° C. in air without suffering damage. These physical characteristics make silicon carbide an ideal substitute for naturally occurring gemstones. The use of silicon carbide as gemstones is described in U.S. Pat. Nos. 5,723,391 and 5,762,896 to Hunter et al.

Accordingly, and because the physical characteristics and potential uses for silicon carbide have been recognized for some time, a number of researchers have suggested a number of techniques for forming crystals of silicon carbide. These techniques generally fall into two broad categories, although it will be understood that some techniques are not necessarily so easily classified. The first technique is known as chemical vapor deposition (CVD) in which reactants and gases are introduced into a system within which they form silicon carbide crystals upon an appropriate substrate.

The other main technique for growing silicon carbide crystals is generally referred to as the sublimation technique. As the designation "sublimation" implies, sublimation techniques generally use some kind of solid silicon carbide starting material, which is heated until the solid silicon carbide sublimes. The vaporized silicon carbide starting material is then encouraged to condense on a substrate, such as a seed crystal, with the condensation intended to produce the desired crystal polytype.

One of the first sublimation techniques of any practical usefulness for producing better crystals was developed in the 1950s by J. A. Lely, and is described in U.S. Pat. No. 2,854,364. From a general standpoint, Lely's technique lines the interior of a carbon vessel with a silicon carbide source material. By heating the vessel to a temperature at which silicon carbide sublimes, and then allowing it to condense, re-crystallized silicon carbide is encouraged to deposit along the lining of the vessel.

The Lely sublimation technique was modified and improved upon by several researchers. Hergenrother, U.S. Pat. No. 3,228,756 ("Hergenrother '756") discusses another sublimation growth technique, which utilizes a seed crystal of silicon carbide upon which other silicon carbide condenses to grow a crystal. Hergenrother '756 suggests that in order to promote proper growth, the seed crystal must be heated to an appropriate temperature, generally over 2000° C. in such a manner that the time period during which the seed crystal is at temperatures between 1800° C. and 2000° C. is minimized.

Ozarow, U.S. Pat. No. 3,236,780 ("Ozarow '780") discusses another unseeded sublimation technique which utilizes a lining of silicon carbide within a carbon vessel. Ozarow '780 attempts to establish a radial temperature gradient between the silicon carbide lined inner portion of the vessel and the outer portion of the vessel.

Knippenberg, U.S. Pat. No. 3,615,930 ("Knippenberg '930") and U.S. Pat. No. 3,962,406 ("Knippenberg '406") discuss alternative methods for growing silicon carbide in a desired fashion. The Knippenberg '930 patent discusses a method of growing p-n junctions in silicon carbide as a crystal grows by sublimation. According to the discussion in this patent, silicon carbide is heated in an enclosed space in the presence of an inert gas containing a donor type dopant atom. The dopant material is then evacuated from the vessel and the vessel is reheated in the presence of an acceptor dopant. This technique is intended to result in adjacent crystal portions having opposite conductivity types thereby forming a p-n junction.

The Knippenberg '406 patent discusses a three-step process for forming silicon carbide in which a silicon dioxide core is packed entirely within a surrounding mass of either granular silicon carbide or materials that will form silicon carbide. The packed mass of silicon carbide and silicon dioxide is then heated. The system is heated to a temperature at which a silicon carbide shell forms around the silicon dioxide core, and then further heated to vaporize the silicon dioxide from within the silicon carbide shell. Finally, the system is heated even further to encourage additional silicon carbide to continue to grow within the silicon carbide shell.

Vodakov, U.S. Pat. No. 4,147,572 discusses a geometry oriented sublimation technique in which solid silicon carbide source material and seed crystals are arranged in a parallel close proximity relationship to another.

Addamiano, U.S. Pat. No. 4,556,436 ("Addamiano '436") discusses a Lely-type furnace system for forming thin films of beta silicon carbide on alpha silicon carbide which is characterized by a rapid cooling from sublimation temperatures of between 2300° C. and 2700° C. to another temperature of less than 1800° C. Addamiano '436 notes that large single crystals of cubic (beta) silicon carbide are simply not available and that growth of silicon carbide or other materials such as silicon or diamond is rather difficult.

Hsu, U.S. Pat. No. 4,664,944, discusses a fluidized bed technique for forming silicon carbide crystals which resembles a chemical vapor deposition technique in its use of non-silicon carbide reactants, but which includes silicon carbide particles in the fluidized bed, thus somewhat resembling the sublimation technique.

German (Federal Republic) Patent No. 3,230,727 to Siemens Corporation discusses a silicon carbide sublimation technique in which the emphasis of the discussion is the minimization of the thermal gradient between a silicon carbide seed crystal and silicon carbide source material. This patent suggests limiting the thermal gradient to no more than 20° C. per centimeter of distance between source and seed in the reaction vessel. This patent also suggests that the overall vapor pressure in the sublimation system be kept in the range of between 1 and 5 millibar and preferably around 1.5 to 2.5 millibar.

Davis, U.S. Pat. No. Re. 34,861 ("Davis '861") discuss a method of forming large device quality single crystals of silicon carbide. This patent presents a sublimation process enhanced by maintaining a constant polytype composition and size distribution in the source materials. These patents also discuss specific preparation of the growth surface and seed crystals and controlling the thermal gradient between the source materials and the seed crystal.

Barrett, U.S. Pat. No. 5,746,827 ("Barrett '827") discusses a method for producing large diameter silicon carbide crystals requiring two growth stages. The first growth stage is to isothermally grow a seed crystal to a larger diameter. The second growth stage is to grow a large diameter boule from the seed crystal under thermal gradient conditions.

Hopkins, U.S. Pat. No. 5,873,937 ("Hopkins '937") discusses a method for growing 4H silicon carbide crystals. This patent teaches a physical vapor transport (PVT) system where the surface temperature of the crystal is maintained at less than about 2160° C. and the pressure inside the PVT system is decreased to compensate for the lower growth temperature.

Kitoh, U.S. Pat. No. 5,895,526 ("Kitoh '526") teaches a sublimation process for growing a single silicon carbide crystal where the sublimed source material flows parallel with the surface of a single crystal substrate.

Although significant progress in the production of SiC crystals has occurred over the years, commercially significant goals still remain for SiC crystal production. For example, faster and more powerful prototype devices are being developed that require larger SiC crystals that maintain or improve upon current crystal quality. Boules large enough to produce 50-mm diameter SiC wafers are currently at the far end of commercially viable SiC production. 75-mm diameter wafers of good quality have been demonstrated but are not yet commercially available and there is already a need for 100-mm wafers. Many SiC crystal production techniques are simply incapable of economically and consistently producing crystals of the size and quality needed. The primary reason for the inability of most crystal production techniques to keep up with commercial demand lies within the chemistry of SiC.

The chemistry of silicon carbide sublimation and crystallization is such that the known methods of growing silicon carbide crystals are difficult, even when carried out successfully. The stoichiometry of the crystal growth process is critical and complicated. Too much or too little silicon or carbon in the sublimed vapor may result in a crystal having an undesired polytype or imperfections such as micropipes.

Likewise, the high operating temperatures, typically above 2100° C. and the necessity of forming specific temperature gradients within the crystal growth system pose significant operational difficulties. The traditional graphite sublimation containers utilized in most sublimation systems possess infrared emissivities on the order of 0.85 to 0.95 depending upon the container's surface characteristics. Seed crystals are heat sensitive to infrared radiation. Therefore, the infrared radiation emitted by the graphite containers can overheat the seed crystal thereby complicating the precise temperature gradients necessary for successful operation of sublimation systems.

Recently, the SIC group at Linkoping University presented a technique for the growth of SiC called High Temperature Chemical Vapor Deposition ("HTCVD"). O. Kordina, et al., "High Temperature Chemical Vapor Deposition," paper presented at the International Conference on SIC and Related Materials, Kyoto, Japan, 1995: See also O. Kordina, et al., 69 Applied Physics Letters, 1456 (1996). In this technique, the solid silicon source material is replaced by gases such as silane. The use of gaseous source materials improves control of the reaction stoichiometry. The solid carbon source material may also be replaced by a gas such as propane; however, most of the carbon utilized in this technique actually comes from the graphite walls of the crucible. Theoretically, this technique's utilization of a continuous supply of gas would allow continuous and extended SIC boule growth. Unfortunately, the HTCVD technique has not proven commercially useful for boule growth primarily because the reaction destroys the graphite crucibles used in the process. Furthermore, the addition of hydrocarbon gases in this particular process tends to produce Si droplets encrusted with SiC which decreases efficiency and also ties up Si and C thereby altering the stoichiometry of the system.

Perhaps the most difficult aspect of silicon carbide growth is the reactivity of silicon at high temperatures. Silicon reacts with the graphite containers utilized in most sublimation processes and, as noted above, is encouraged to do so in some applications. This reaction is difficult to control and usually results in too much silicon or too much carbon being present in the system thus undesirably altering the stoichiometry of the crystal growth process. In addition, silicon's attack on the graphite container pits the walls of the container destroying the container and forming carbon dust which contaminates the crystal.

In attempts to resolve these problems, some research has evaluated that the presence of tantalum in a sublimation system, e.g., Yu. A. Vodakov et al, "The Use of Tantalum Container Material for Quality Improvement of SiC Crystals Grown by the Sublimation Technique," presented at the $6^{th}$ International Conference on Silicon Carbide, September 1995, Kyoto, Japan. Some researchers opine that the presence of tantalum helps maintain the required stoichiometry for optimal crystal growth. Such an opinion is supported by reports that sublimation containers comprising tantalum are less susceptible to attack by reactive silicon.

In a related application, WO97/27350 ("Vodakov '350") Vodakov presents a sublimation technique similar to that presented in U.S. Pat. No. 4,147,572 and attempts to address the problem of silicon attacking the structural components of the sublimation system. Vodakov '350 describes a geometry oriented sublimation technique in which solid silicon carbide source materials and seed crystals are arranged in parallel close proximity relationship to another. Vodakov '350 utilizes a sublimation container made of solid tantalum. The inner surface of Vodakov's tantalum container is described as being an alloy of tantalum, silicon and carbon. Page 11, line 26 through page 12, line 10. Vodakov claims that such a container is resistive to attack by silicon vapor and contributes to well-formed silicon carbide crystals.

The cost of tantalum is, however, a drawback to a sublimation process utilizing the container described in Vodakov. A sublimation container of solid tantalum is extremely expensive and like all sublimation containers, will eventually fail, making its long-term use uneconomic. A solid tantalum sublimation container is also difficult to machine. Physically forming such a container is not an easy task. Lastly, the sublimation process of Vodakov '350 suffers the same deficiency shown in other solid source sublimation techniques in that it is not efficient at forming the large, high quality boules needed for newly discovered applications.

Therefore, a need exists for a process that provides for controlled, extended and repeatable growth of high quality SiC crystals. Such a system must necessarily provide a container that is resistive to attack by silicon. Such a system should also be economical to implement and use.

Figure 9:
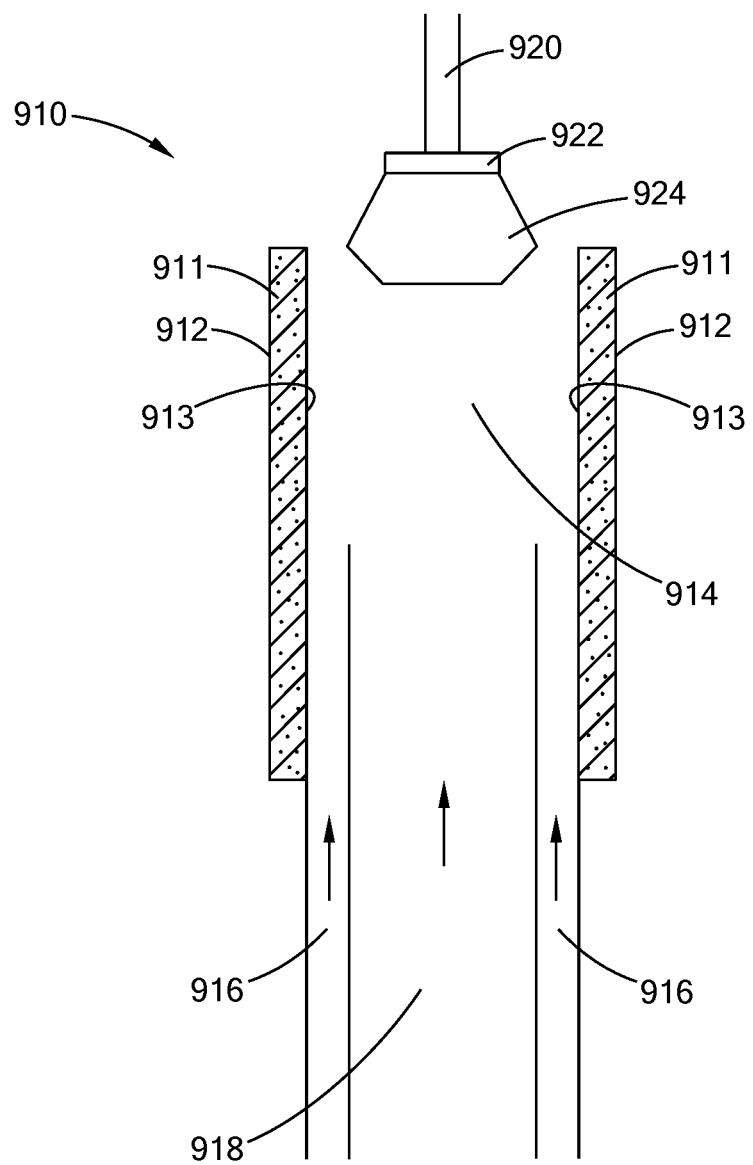
FIG. 9 is a schematic cross sectional diagram of a vapor deposition apparatus utilizing ultra pure SiC or SiOC materials in accordance with the present inventions.

The GFS system of FIG. 9 comprises a crucible broadly designated at 910. It is to be understood that the crucible 910 is a substantially enclosed structure similar to the type normally used in SiC sublimation techniques. Reference is made to the crucible in Barrett '827; the growth chamber of Hopkins '937; and the crucibles shown in the figures of Davis '861 as being exemplary, but not limiting, of the crucibles, vessels, or containers of the present embodiment. These references also demonstrate that the broad parameters of sublimation growth are relatively well understood in this art. Accordingly, these will not be addressed in detail herein, other than to describe the features of the present embodiment. The crucible 910 is generally cylindrical in shape and includes a cylindrical wall 911 having an outer surface 912 and an inner surface 913. The cylindrical wall 911 is made of graphite coated with material characterized by a melting point above the sublimation temperature of SiC. The coating material is also characterized by chemical inertness with respect to silicon and hydrogen at the temperatures in question. Metal carbides and particularly the carbides of tantalum, hafnium, niobium, titanium, zirconium, tungsten and vanadium and mixtures thereof exhibit the desired characteristics of the required coating. Metal nitrides, and particularly the nitrides of tantalum, hafnium, niobium, titanium, zirconium, tungsten and vanadium and mixtures thereof also exhibit the desired characteristics of the required coating. Furthermore, mixtures of metal carbides and metal nitrides such as those listed previously may be used as the coating substance. For ease of discussion and reference, the remainder of the detailed description will refer to metal carbides although it is understood that the concepts and principles discussed herein are equally applicable to metal nitride coatings.

In all instances described herein, it is to be understood that graphite components exposed to the source materials are coated with a metal carbide coating. The metal carbide coating may be provided by any of several commercially available coating processes such at that practiced by Ultramet Corporation of Pacoima, Calif. or Advance Ceramics Corporation of Lakewood, Ohio. Additionally, the graphite components described herein are made from a graphite which has approximately the same coefficient of thermal expansion as the selected metal carbide. Such materials are commercially available. The relative similarities of thermal coefficients of expansion are a particular requirement for materials heated to the extremely high temperatures described herein. In this manner, the likelihood of the graphite or metal carbide coating cracking during the crystal growth process is substantially reduced and the lifetime of the crucible will generally be increased.

The cylindrical wall 911 radially encloses a reaction area generally designated at 914. Outer 916 and inner 918 concentric source gas pathways supply the source gas materials to the reaction area 914. Although the source gases could be mixed prior to entering the reaction area 914, separation of the source gases until each gas is heated to approximately the reaction temperature helps prevent any undesired side reactions between the silicon source gas and the carbon source gas. The concentric source gas pathways keep the source gas materials separated from one another until the point where the source gases enter the reaction area 914. In a preferred embodiment the outer concentric source gas pathway 916 supplies the carbon source gas to the reaction area 914 and the inner concentric source gas pathway 918 supplies the silicon source gas.

In typical sublimation systems the graphite walls of the crucible are used as a source of carbon. The metal carbide coating diminishes the availability of this source of carbon although it appears that under certain circumstances the coated graphite may still act as a source of some carbon for the system. Accordingly, the majority of the carbon needed is supplied from an outside source, such as a carbon source gas. Suitable carbon source gases include any hydrocarbon capable of reacting with Si to form SiC: $C_2$ to $C_8$ hydrocarbons and in particular ethylene ($C_2H_4$) work. The carbon source gas stream may also comprise one or more carrier gases such as He or $H_2$.

Suitable silicon source gases include any gas which will react with available carbon to form SiC. Silane ($SiH_4$) is probably the most well-known of the possible silicon source gases and works. Other suitable sources of silicon include chlorosilane ($SiH_4$-$xCl_x$) and methyltrichlorosilane ($CH_3SiCl_3$). Chlorosilanes require $H_2$ to react, however. The silicon source gas stream may also comprise a suitably inert carrier gas such as He.

A seed crystal 922 is secured on a seed holder 920 and lowered into the reaction area 914. The source gases react within the reaction area 914 to form SiC vapor which eventually deposits on the surface of the seed crystal 922 to form a boule 924. It is believed that at least a portion of the SiC first deposits on the inner wall 913, then sublimes to recondense on the growth surface (seed crystal 922 or boule 924). Under most circumstances, the seed crystal is preferably SiC of the same polytype as the desired growth.

The composition of the source gases may be kept constant or varied during the growth process depending upon the required stoichiometry, type of crystal desired and the physical characteristics of the crystal growth system.

Those familiar with the physical chemistry of solids, liquids and gases know that crystal growth is in most circumstances encouraged on a growth surface if the surface is at a somewhat lower temperature than the fluid (either gas or liquid) which carries the molecules or atoms to be condensed. The GFS system is no exception. A thermal gradient is established between the growth surface and the source material. Although the exact dimensions of the temperature gradient may vary depending upon the pressure of the system, desired polytype, source gas composition, etc., the following general principle is usually applicable to all types of SiC crystal growth processes, including the GFS system. The temperature of the silicon source and carbon source should be raised to a temperature sufficient for the formation of the vaporized species while the temperature of the crystal growth surface is elevated to a temperature approaching the temperature of silicon and carbon sources, but lower than the temperature of the silicon and carbon sources, and lower than that at which SiC will sublime faster than deposit under the gas pressure conditions utilized.

As stated above, numerous variables determine the appropriate temperature gradient for a given system. However, a system such as that described in FIG. 1 is discovered to operate well at seed temperatures between about 1900° C. and about 2500° C. with the inner walls of the reaction area being about 150° C. to about 200° C. hotter than the seed. The maximum growth rate for such a system has yet to be determined. Higher temperatures are known to generally translate into faster growth rates. Higher temperatures, however, can result in sublimation of the seed, which alters the equilibrium of the system and requires additional source gas and potentially other adjustments as well.

The GFS system of FIG. 1 has demonstrated the ability to produce very large high quality crystals of SiC. More importantly, the GFS system of FIG. 1 has demonstrated an ability to withstand attack from the Si compounds that eventually destroy typical graphite crucibles. A test crucible of graphite coated with an approximately 30 micron thick coating of TaC emerged from a crystal growth session unaffected by the harsh environment. Only after several runs have cracks appeared in test crucibles, usually near a sharp corner where the metal carbide coating was less than optimum. However, even when the coating cracks, the crystal growth system is not subject to the carbon dust typically formed when a graphite crucible's integrity is compromised.

The explanation for this surprising property is not fully understood. Although the inventors do not wish to be bound by any particular theory, one possible explanation is that when uncoated graphite is attacked by Si, the Si predominately attacks the weak parts of the graphite, i.e., at the grain boundaries penetrating into the pores. The Si forms SiC which sublimes and is removed as a volatile species. Eventually Si completely erodes the graphite surrounding the grain, leaving the grain behind as a carbon dust particle. It is believed that the metal carbide coating penetrates deep within the graphite pores causing the Si to attack the graphite in a more uniform manner, thereby avoiding the generation of carbon dust.

Surprisingly, a graphite crucible once coated with a metal carbide resists the formation of carbon dust even after substantial spalling of the metal carbide coating. Accordingly, an alternative embodiment is a GFS system comprising a graphite crucible which has at one time been coated with a metal carbide coating but which through use or other circumstances has lost some or all of its metal carbide coating. Such a system is capable is producing quality SiC crystals without contamination from carbon dust.

Additionally, the GFS system of FIG. 1 has demonstrated the ability to provide improved control of the temperature gradients within the crystal growth system. As discussed previously, seed crystals are sensitive to infrared radiation and graphite possesses an infrared emissivity of between about 0.85 to about 0.95 depending upon the surface of the graphite. In contrast the infrared emissivity of the metal compound coatings of the embodiment range from approximately 0.4 for ZrC to approximately 0.5 for TaC to approximately 0.6 for NbC. The lower emissivities of the metal compound coatings of the embodiment substantially reduce the amount of infrared radiation impinging upon the seed crystal during crystal growth and can result in a 100° C. or more reduction in seed temperature when compared with uncoated graphite systems. Reducing the amount of infrared radiation removes a potential source of excess heat from the system thereby improving control of the temperature gradients within the system.

It is readily apparent to one skilled in the art that the utilization of a metal carbide coated crucible as described above is readily adaptable to existing SiC crystal growth systems. It will be additionally apparent to those familiar with this art that the use of metal carbide-coated crucibles according to the present embodiment need not be limited to the sublimation growth of SiC. Thus, although the embodiment offers particular advantages with respect to SiC growth, the coatings and coated crucibles, vessels or containers described herein offer structural and functional advantages for the growth of other materials, including other wide band-gap semiconductor materials such as the Group III nitrides, and particularly including gallium nitride (GaN). For example, some researchers have reported a link between the presence of carbon and a yellow luminescence in GaN and non-uniform electrical behavior in In-containing nitrides. Pearton et al, GaN: *Processing, Defects and Devices*, 86 Applied Physics Reviews, 1 (July 1999). The utilization of the coated apparatus and method of the embodiment advantageously reduces the availability of carbon as a potential residual impurity in MOCVD nitrides.

FIG. 10 illustrates a cross-sectional view of another GFS system used in accordance with the method of the present embodiment. The crucible is broadly designated at 1010. The crucible 1010 is located within a furnace indicated generally at 108. Methods and apparatus, such as a furnace, for supplying heat to SiC and other crystal growth systems are well known to those skilled in the art, and thus will not be otherwise discussed in detail herein.

The crucible 1010 is generally cylindrical in shape and includes a lid 1026 and a bottom 1028 that substantially encloses an intermediate cylindrical portion 1030. The intermediate cylindrical portion 1030 comprises an outer cylinder 1032 having a top and a bottom and an inner diameter and an outer diameter. Situated within the inner diameter of the outer cylinder 1032 is an inner cylinder 1034 also having a top and a bottom, and an inner diameter and an outer diameter. The outer cylinder 1032 and the inner cylinder 1034 form inner 1038 and outer 1036 concentric gas pathways.

In a preferred embodiment the intermediate cylindrical portion 1030 also comprises at least one spacer ring 1040 situated between the outer cylinder 1032 and the lid 1026. The spacer ring 1040 is defined by an inner diameter and an outer diameter with said inner diameter being less than the outer diameter of the inner cylinder 1034. The spacer ring 1040 and the lid 1026 generally define a reaction area 1042 above the outer and inner cylinders 1032 and 1034 respectively. It is to be understood that the spacer ring 40 is an optional component. When used, however, the spacer ring 1040 preferably incorporates the refractory metal carbide coating of the present embodiment. Alternatively, the outer cylinder 1032 can be extended to replace the spacer ring 1040. However, the use of a spacer ring or rings is recommended because of the flexibility provided in adjusting the size of the reaction area 1042 and thus the thermal gradient. In a further alternative, the spacer ring 1040 can be used in conjunction with other similarly shaped devices such as a growth disk (a ring with a venturi-like opening that focuses upward flowing SiC vapor) or a collection disk (a porous disk that allows SiC vapor to flow upward while collecting solid particles that fall from the walls of the crucible). Collecting these particles onto a hot collection disk permits them to resublime and contribute to the growth of the crystal.

Extending into the reaction area 1042 from the lid 1026 is a seed crystal 1044 supported by a seed holder 1046 and a graphite rod 1048. The seed crystal 1044 acts as a substrate for the growth of a SiC boule 1050.

Two gas sources 1052 and 1054 are in fluid communication with the inner and outer concentric gas pathways and provide the silicon and carbon source gases utilized in the SiC crystal growth process. In a preferred embodiment one gas source 1052 supplies the carbon source gas to the outer concentric gas pathway 1036 and the other gas source 1054 supplies the silicon source gas to the inner concentric gas pathway 1038. The reaction to form SiC vapor and the desired SiC boule proceeds as previously described with respect to FIG. 9. A gas outlet 1027 incorporated into the lid 1026 and extending through the underlying seed holder 1046 provides a means for evacuation of gas from the reaction area 1042.

It will be further understood that relevant portions of the systems referred to earlier (e.g., Davis, Vodakov, etc.) could be modified and improved to incorporate the coated surfaces, vessels, and systems described herein, and would thus fall within the parameters of the present embodiment.

Example 29

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 7,501,022 the entire disclosure of which is incorporated herein by reference.

Example 30

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 8,377,806 the entire disclosure of which is incorporated herein by reference.

Example 31

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 6,706,114 the entire disclosure of which is incorporated herein by reference.

Example 32

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 8,492,827 the entire disclosure of which is incorporated herein by reference.

Example 33

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 8,329,133 the entire disclosure of which is incorporated herein by reference.

Example 33

6-nine pure, and preferably 7-nines pure (greater purity may also be used) polysilocarb derived SiC or SiOC that is disclosed and taught in patent application Ser. No. 14/864,539 (US Publication No. 2016/0208412), Ser. No. 14/864,125 (US Publication No. 2016/0207782), and PCT/US2015/051997 (Publication No. WO 2016/049344) is used, for example as, seed crystals, starting crystal, growth material, source material, deposition material or raw material, is used in the apparatus and processes taught and disclosed in U.S. Pat. No. 6,0191,841 the entire disclosure of which is incorporated herein by reference.

It is noted that there is no requirement to provide or address the theory underlying the novel and groundbreaking processes, materials, performance or other beneficial features and properties that are the subject of, or associated with, embodiments of the present inventions. Nevertheless, various theories are provided in this specification to further advance the art in this area. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of formulations, batches, materials, compositions, devices, systems, apparatus, operations activities and methods set forth in this specification may be used in the various fields where SiC and Si find applicability, as well as, in other fields, where SiC, Si and both, have been unable to perform in a viable manner (either cost, performance or both). Additionally, these various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The inventions may be embodied in other forms than those specifically disclosed herein without departing from their spirit or essential characteristics. The described embodiments are to be considered in all respects only as illustrative and not restrictive.

What is claimed:

1. A method of making boule for the production of a 6H N-Type silicon carbide wafer, having a diameter of from about 6 inches to about 10 inches, the wafer characterized with properties comprising:
   type/dopant:N/nitrogen;
   orientation:<0001>+/−0.5 degree;
   thickness:330±25 um;
   micropipe density of <1 cm-2; and,
   RT:0.02-0.2 Ω·cm;
   the method comprising the steps of: forming a vapor of a polymer derived ceramic SiC starting material, wherein the polymer derived ceramic SiC starting material has a purity of at least about 6 nines, and is oxide layer free; depositing the vapor on a seed crystal to form a boule; and providing the boule to a wafer manufacturing process.

2. The method of claim 1, wherein the seed comprises a polymer derived ceramic SiC.

3. The method of claim 1 wherein the wafer manufacturing process produces a wafer having improved features, when compared to a wafer made from a non-polymer derived SiC material.

4. The method of claim 3, wherein the improved features are selected from the group consisting of bow, edge contour, flatness, focal plane, warp and site flatness.

5. A method of making silicon carbide wafer, the method comprising the steps of forming a vapor of a polymer derived ceramic SiC, the polymer derived ceramic having a purity of at least about 6 nines, and being oxide layer free, depositing the vapor on a seed crystal to form a boule, and providing the boule to a wafer manufacturing process, wherein the boule has a diameter of from about 6" to about 10".

6. The method of claim 5, wherein the seed comprises a polymer derived ceramic SiC.

7. The method of claim 5, wherein the wafer manufacturing process produces a wafer having improved features, when compared to a wafer made from a non-polymer derived SiC material, the improved features selected from the group consisting of bow, edge contour, flatness, focal plane, warp and site flatness.

8. The method of claim 5, wherein the wafer has a diameter of from about 6" to about 10".

9. A method of making boule for the production of a 6H N-Type silicon carbide wafer, having a diameter of from about 4 inches to about 10 inches, the wafer characterized with properties comprising:
   type/dopant:N/nitrogen;
   orientation:<0001>+/−0.5 degree;
   thickness:330±25 um;
   micropipe density of <1 cm-2;
   RT:0.01-0.1 Ω·cm; and,
   Bow/Warp/TTV<25 um;
   the method comprising the steps of: forming a vapor of a polymer derived ceramic SiC starting material; wherein the polymer derived ceramic SiC starting material has a purity of at least about 6 nines; depositing the vapor on a seed crystal to form a boule; and providing the boule to a wafer manufacturing process.

10. The method of claim 9, wherein the seed crystal is polymer derived ceramic SiC.

\* \* \* \* \*